(12) United States Patent
Chou et al.

(10) Patent No.: US 11,387,181 B2
(45) Date of Patent: Jul. 12, 2022

(54) INTEGRATED CIRCUITS WITH BACKSIDE POWER RAILS

(71) Applicant: Taiwan Semiconductor Manufacturing Co., Ltd., Hsinchu (TW)

(72) Inventors: Chih-Chao Chou, Hsinchu (TW); Kuo-Cheng Chiang, Hsinchu County (TW); Shi Ning Ju, Hsinchu (TW); Wen-Ting Lan, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/093,303

(22) Filed: Nov. 9, 2020

(65) Prior Publication Data
US 2021/0057325 A1    Feb. 25, 2021

Related U.S. Application Data

(62) Division of application No. 16/427,831, filed on May 31, 2019, now Pat. No. 10,833,003.

(51) Int. Cl.
*H01L 23/50*      (2006.01)
*H01L 29/78*      (2006.01)
*H01L 27/088*     (2006.01)

(52) U.S. Cl.
CPC .......... *H01L 23/50* (2013.01); *H01L 27/0886* (2013.01); *H01L 29/785* (2013.01)

(58) Field of Classification Search
CPC .... H01L 23/50; H01L 27/0886; H01L 29/785
See application file for complete search history.

(56) References Cited

U.S. PATENT DOCUMENTS

| | | | |
|---|---|---|---|
| 9,496,260 B1* | 11/2016 | Balakrishnan | ........ H01L 29/785 |
| 10,020,261 B2 | 7/2018 | Wu et al. | |
| 10,269,715 B2 | 4/2019 | Wu et al. | |
| 10,282,504 B2 | 5/2019 | Wu et al. | |
| 2015/0364560 A1 | 12/2015 | Wang | |
| 2018/0174953 A1* | 6/2018 | Nam | ................... H01L 29/7853 |
| 2019/0088762 A1* | 3/2019 | Su | ................... H01L 21/823418 |

* cited by examiner

*Primary Examiner* — Peniel M Gumedzoe
(74) *Attorney, Agent, or Firm* — Haynes and Boone, LLP

(57) ABSTRACT

Semiconductor devices and methods are provided. A method according to the present disclosure includes receiving a substrate that includes a first semiconductor layer, a second semiconductor layer, and a third semiconductor layer; forming a plurality of fins over the third semiconductor layer; forming a trench between two of the plurality of fins; depositing a dummy material in the trench; forming a gate structure over channel regions of the plurality of the fins; forming source/drain features over source/drain regions of the plurality of the fins; bonding the substrate on a carrier wafer; removing the first and second semiconductor layers to expose the dummy material; removing the dummy material in the trench; depositing a conductive material in the trench; and bonding the substrate to a silicon substrate such that the conductive material is in contact with the silicon substrate. The trench extends through the third semiconductor layer and has a bottom surface on the second semiconductor layer.

20 Claims, 45 Drawing Sheets

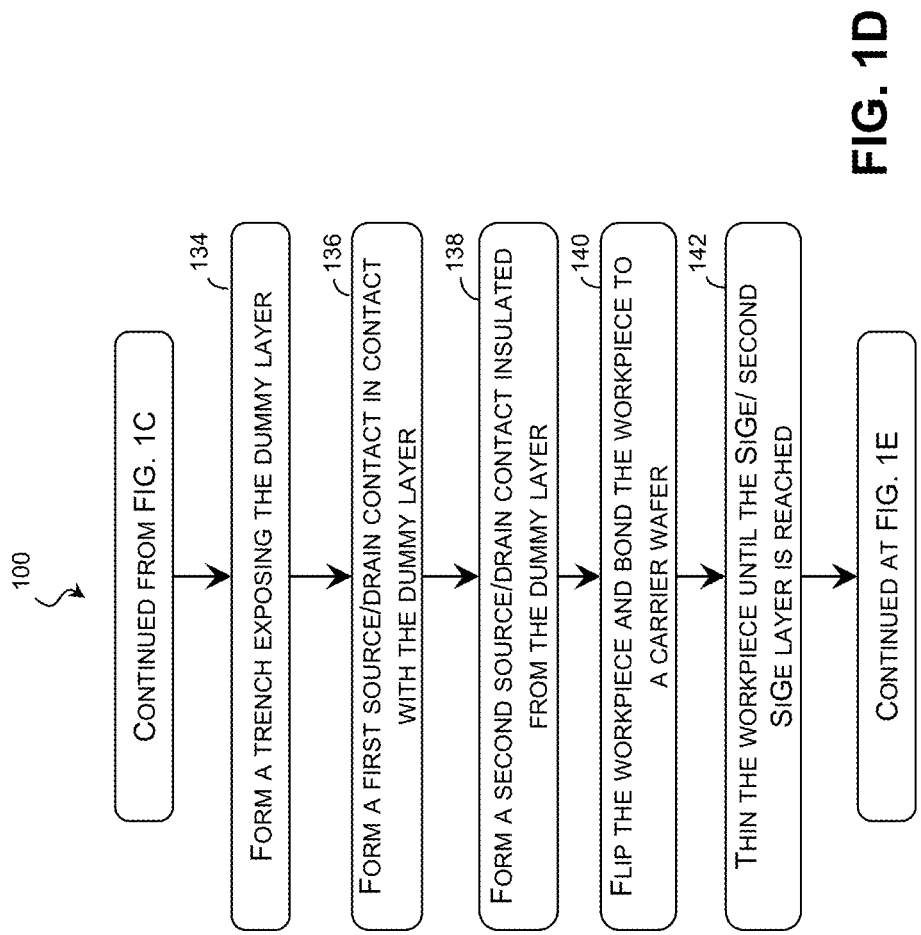

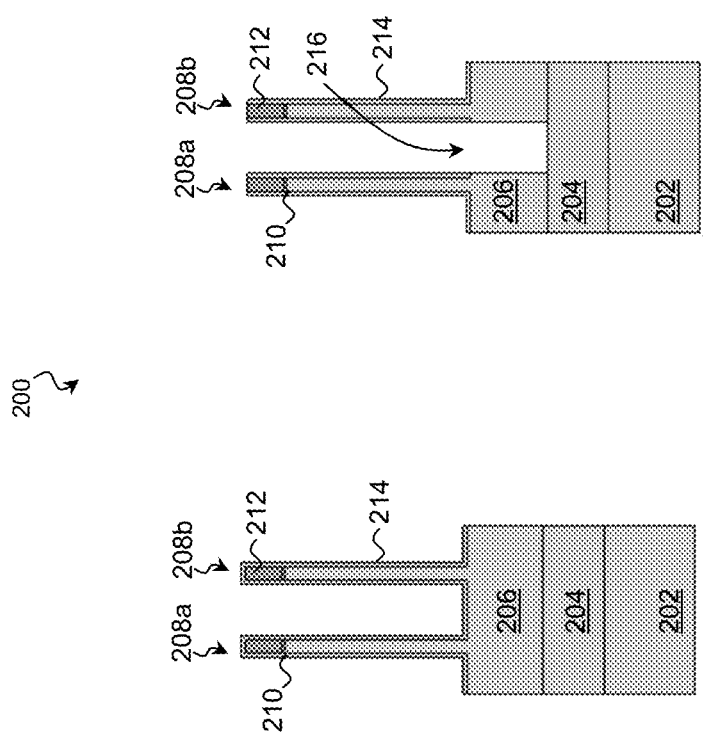

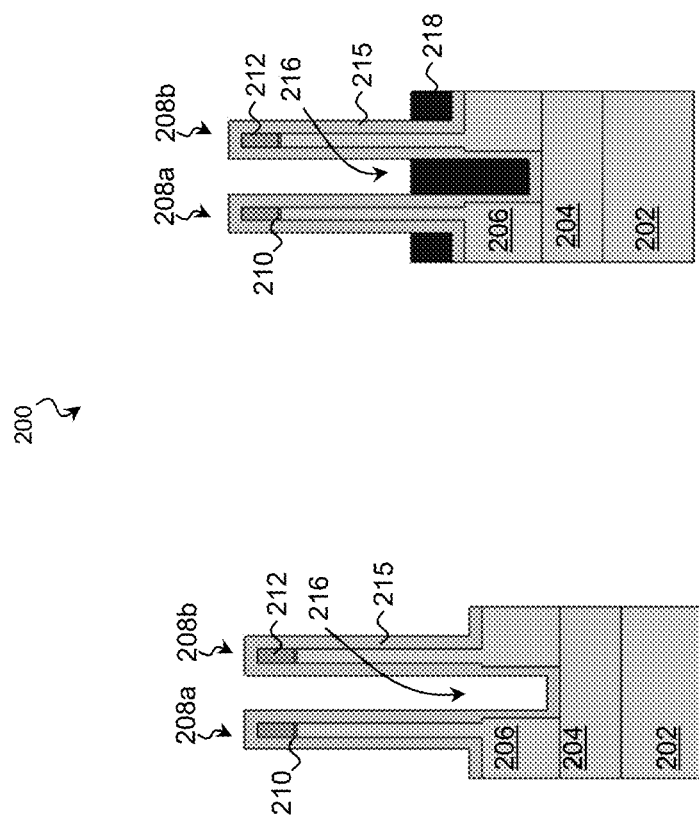

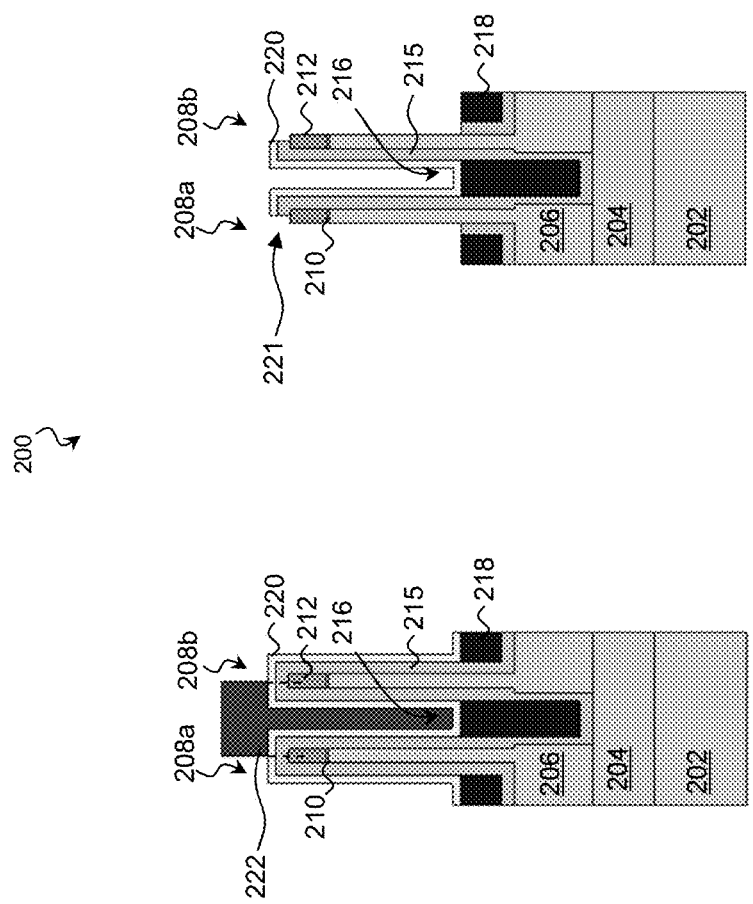

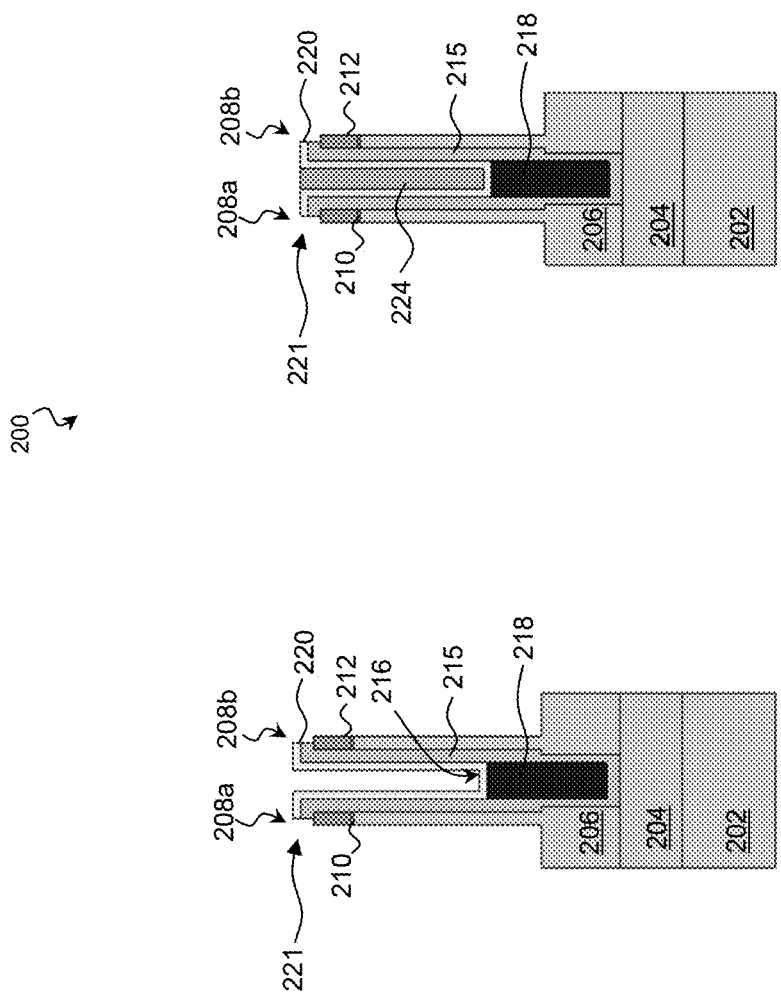

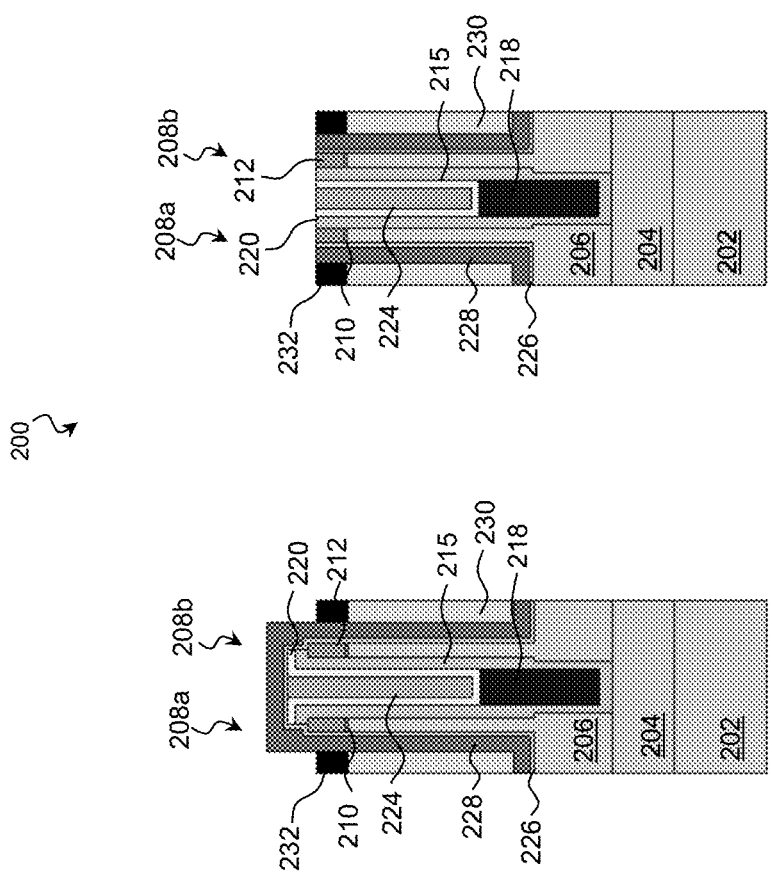

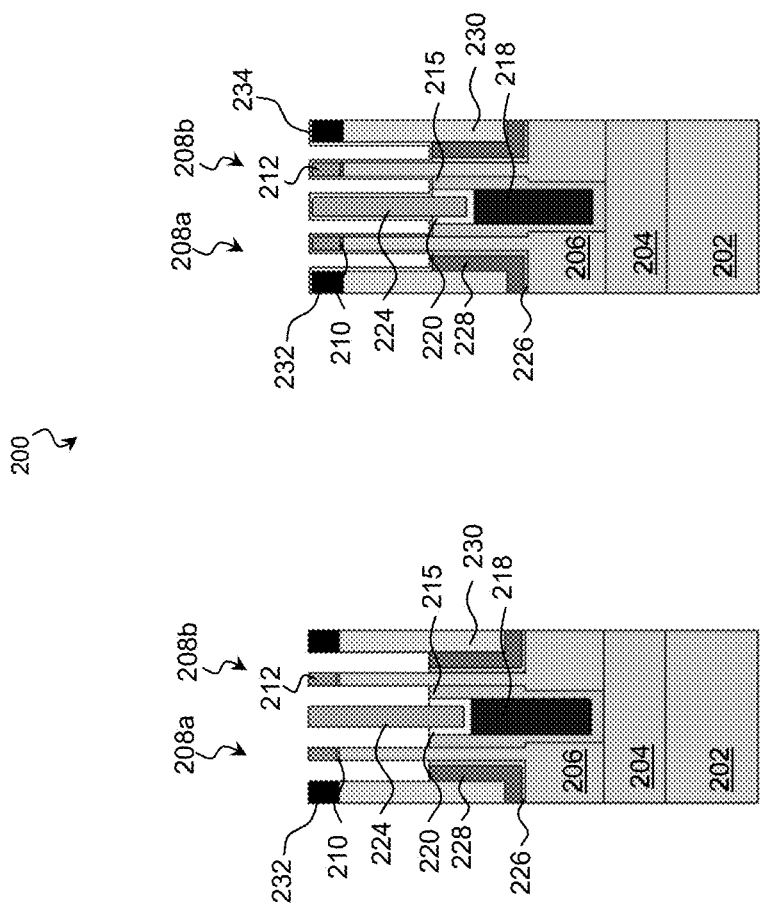

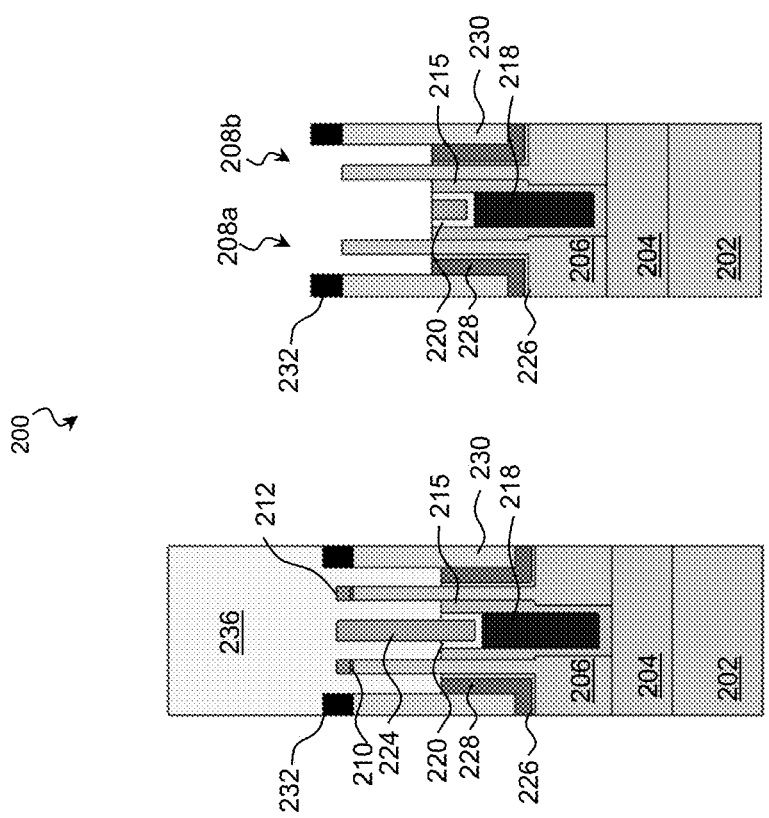

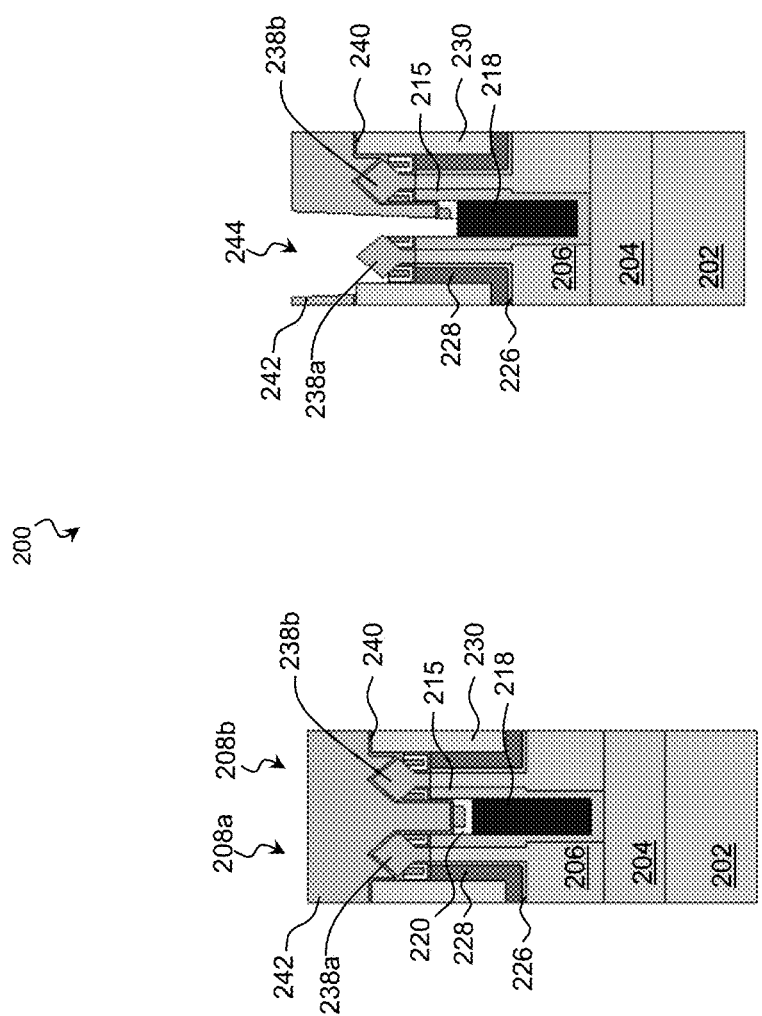

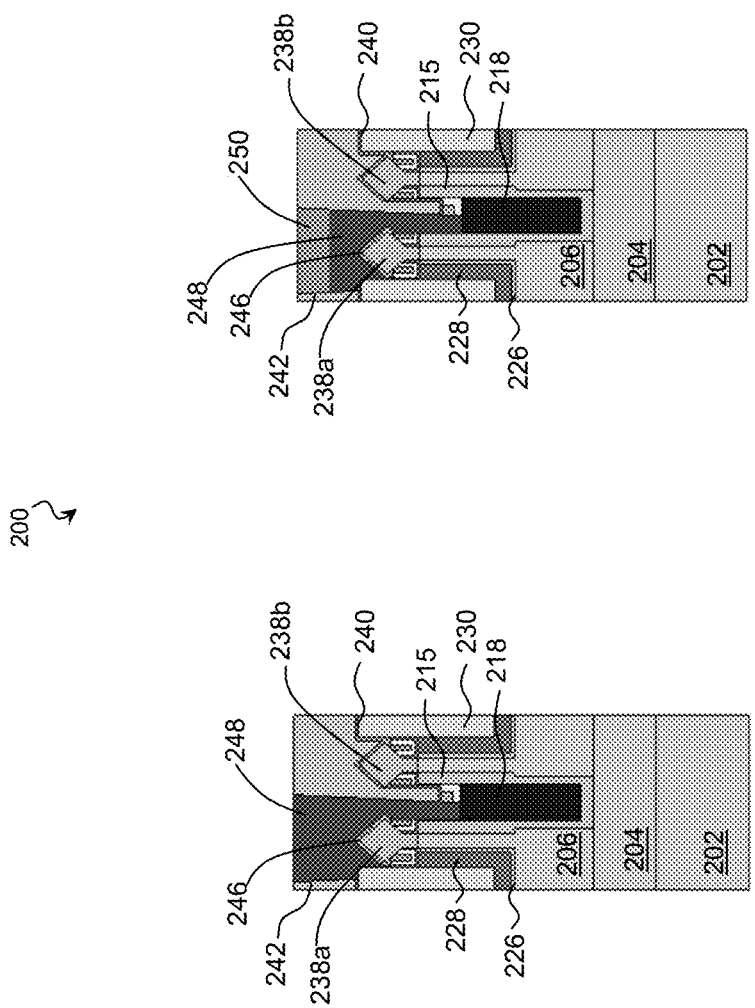

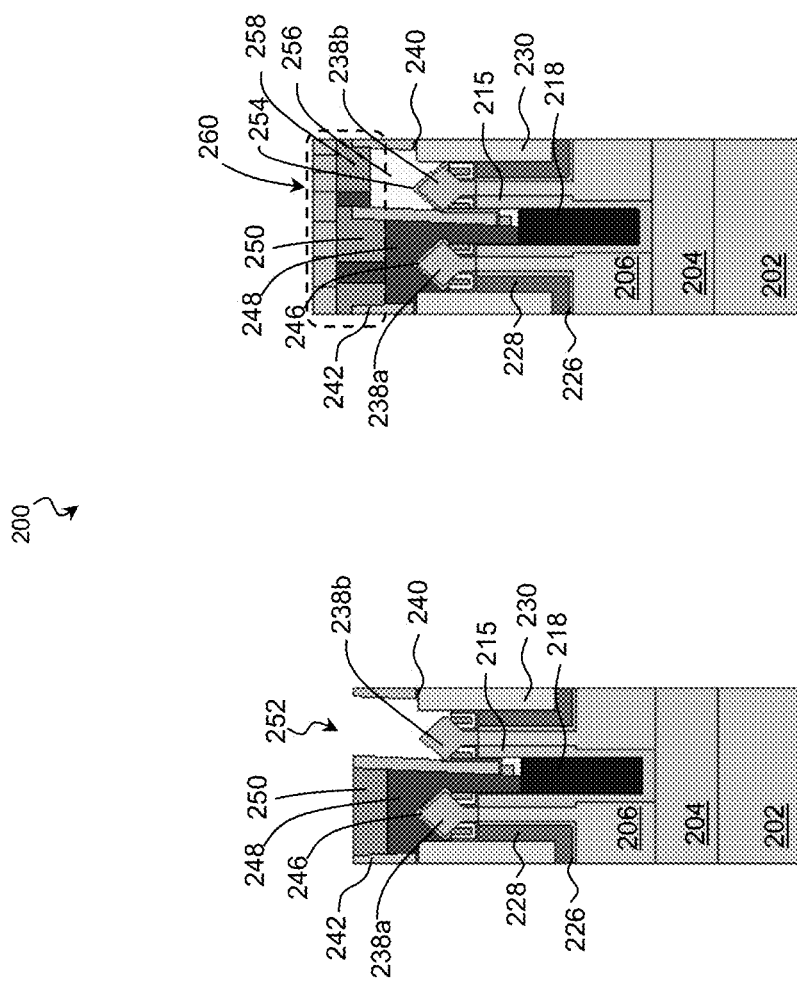

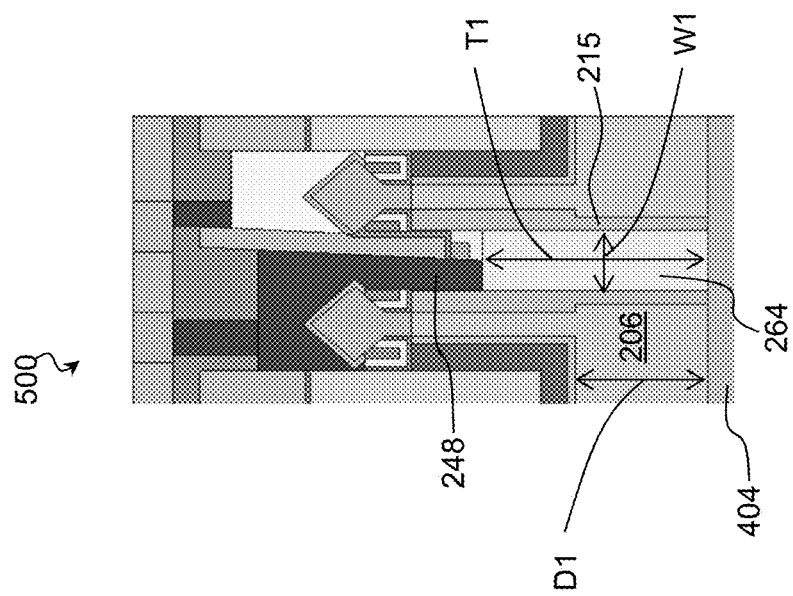

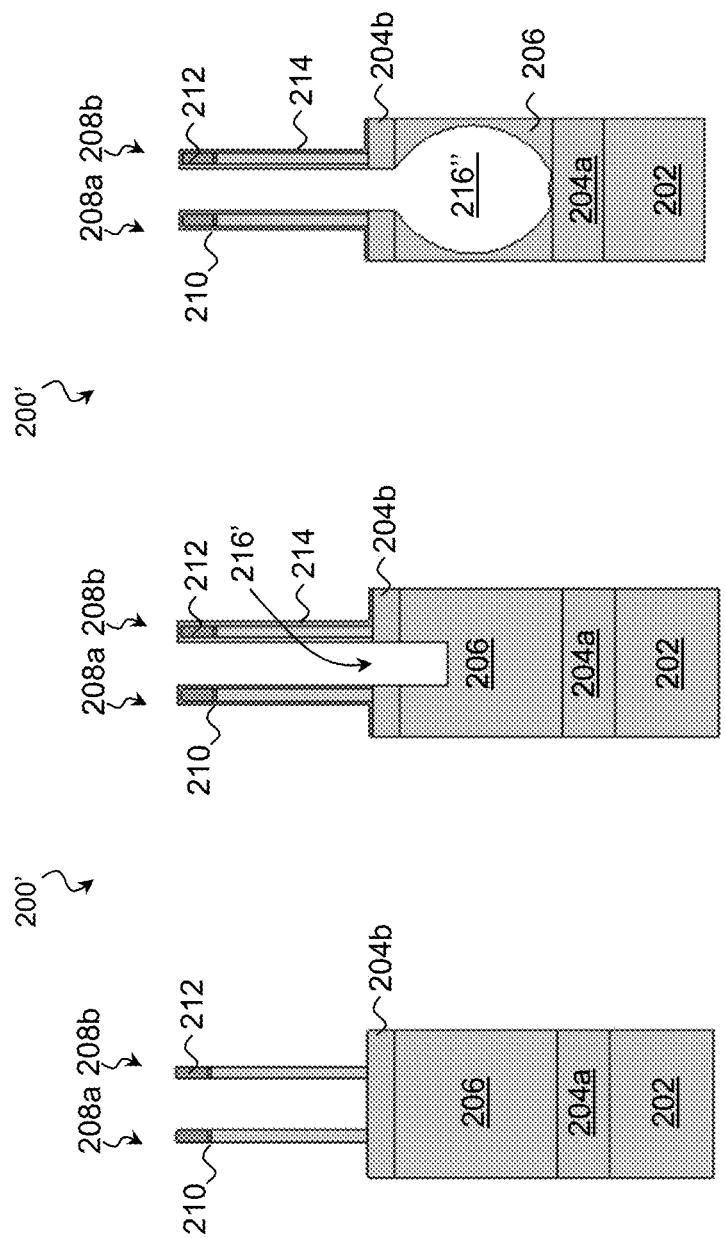

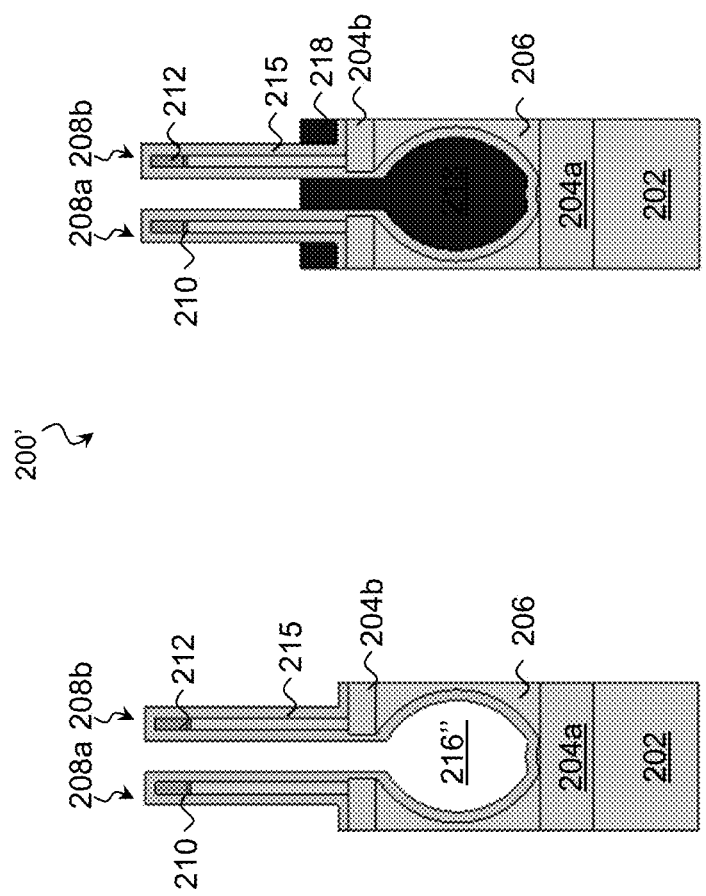

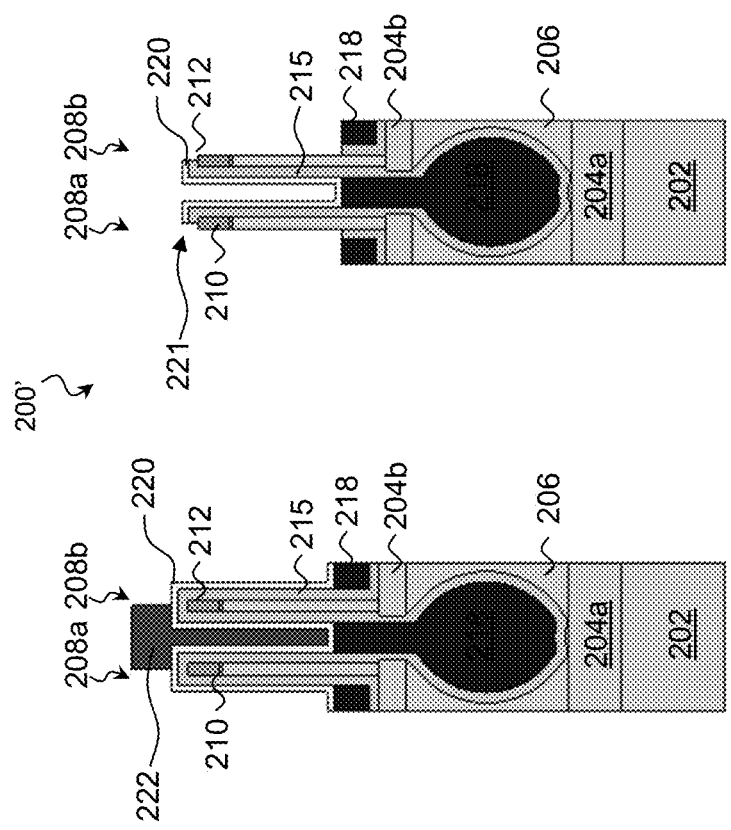

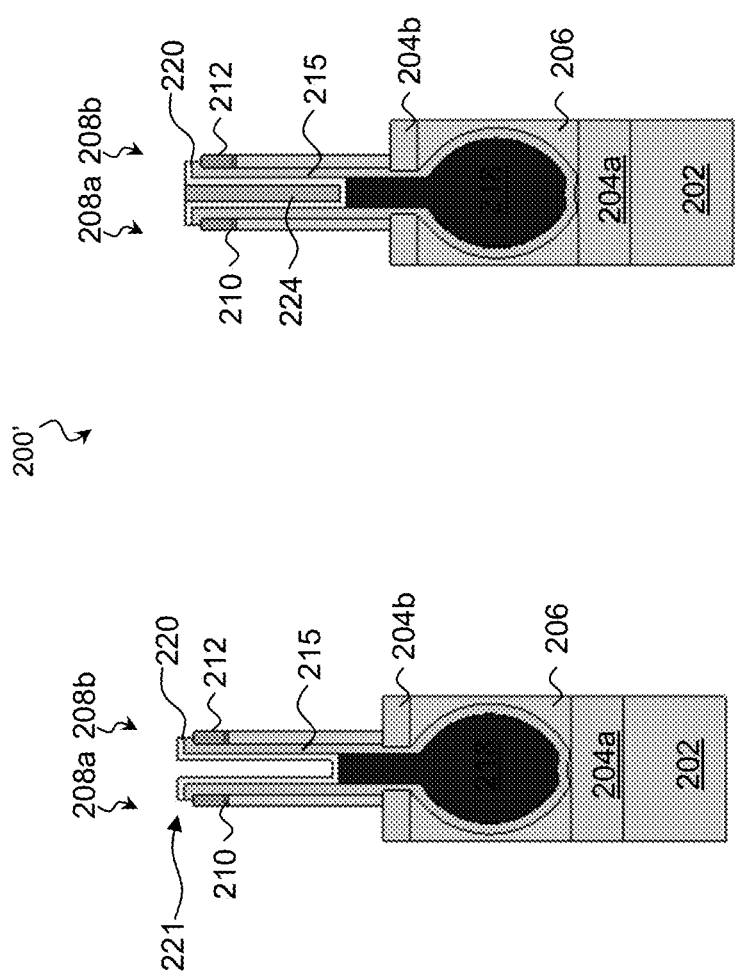

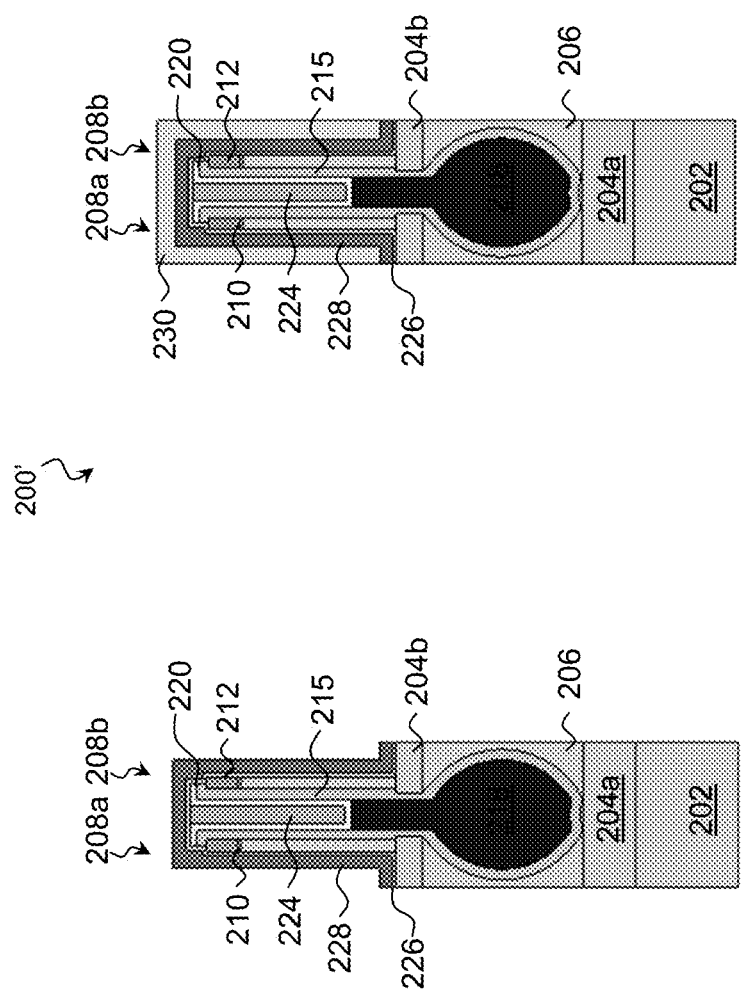

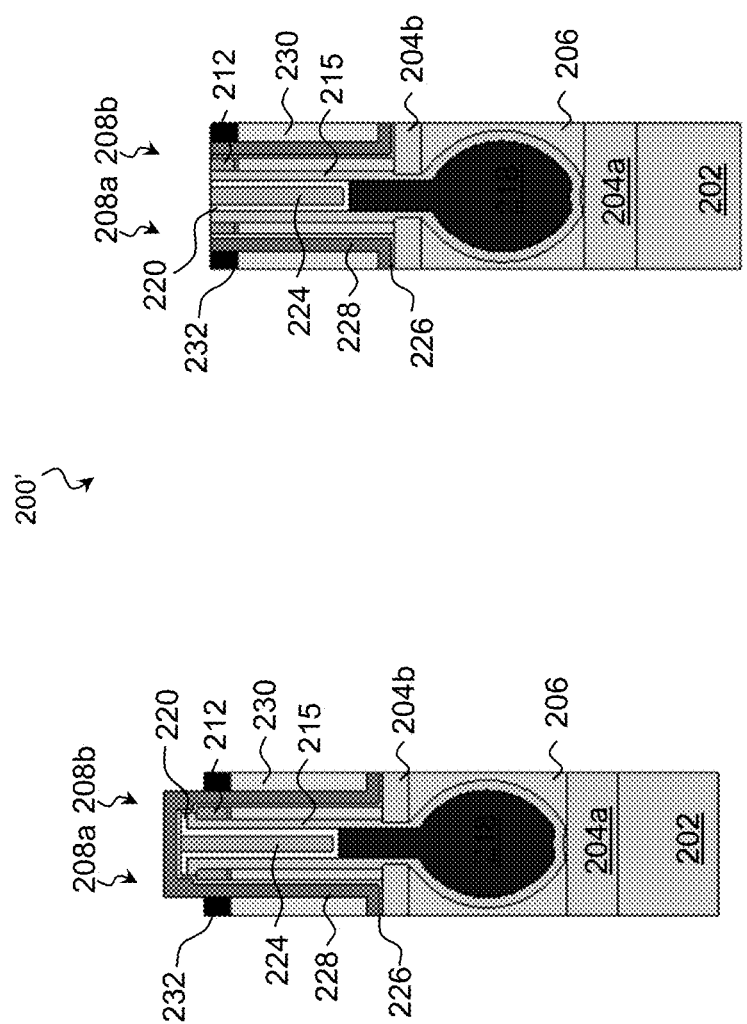

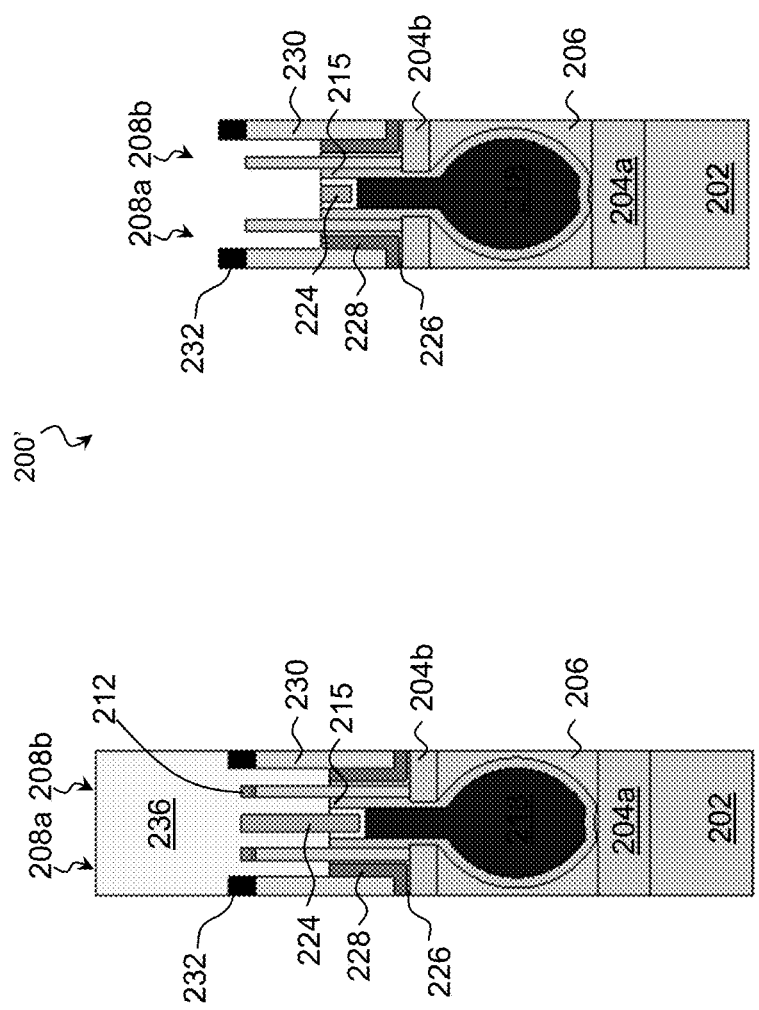

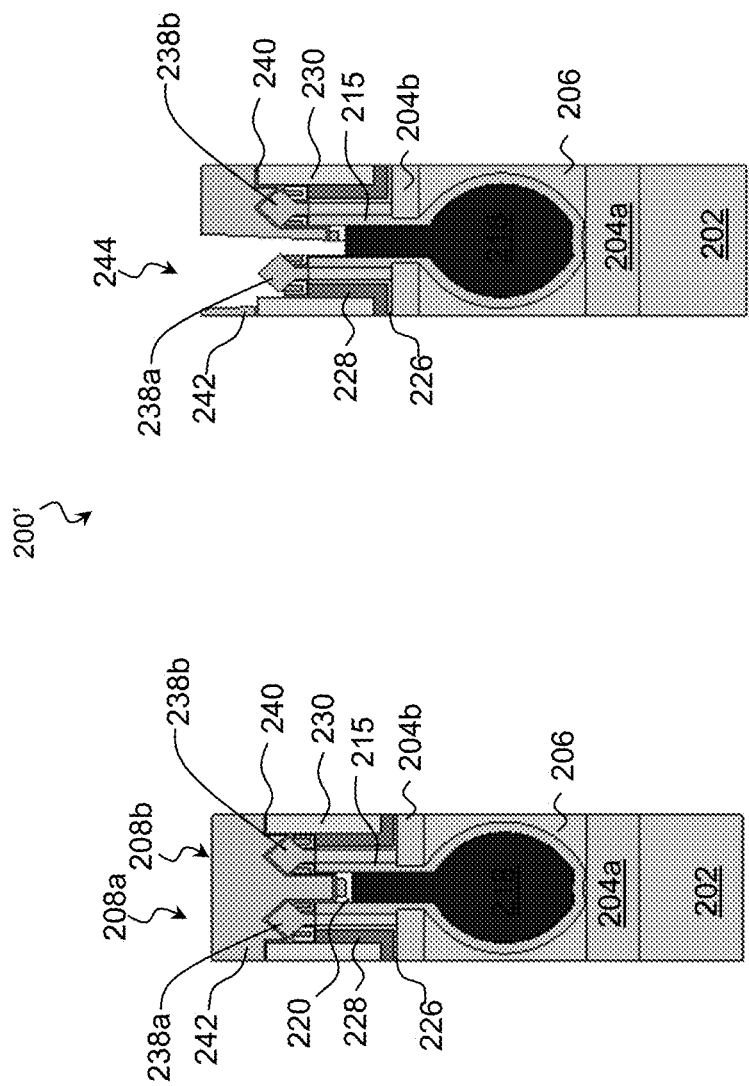

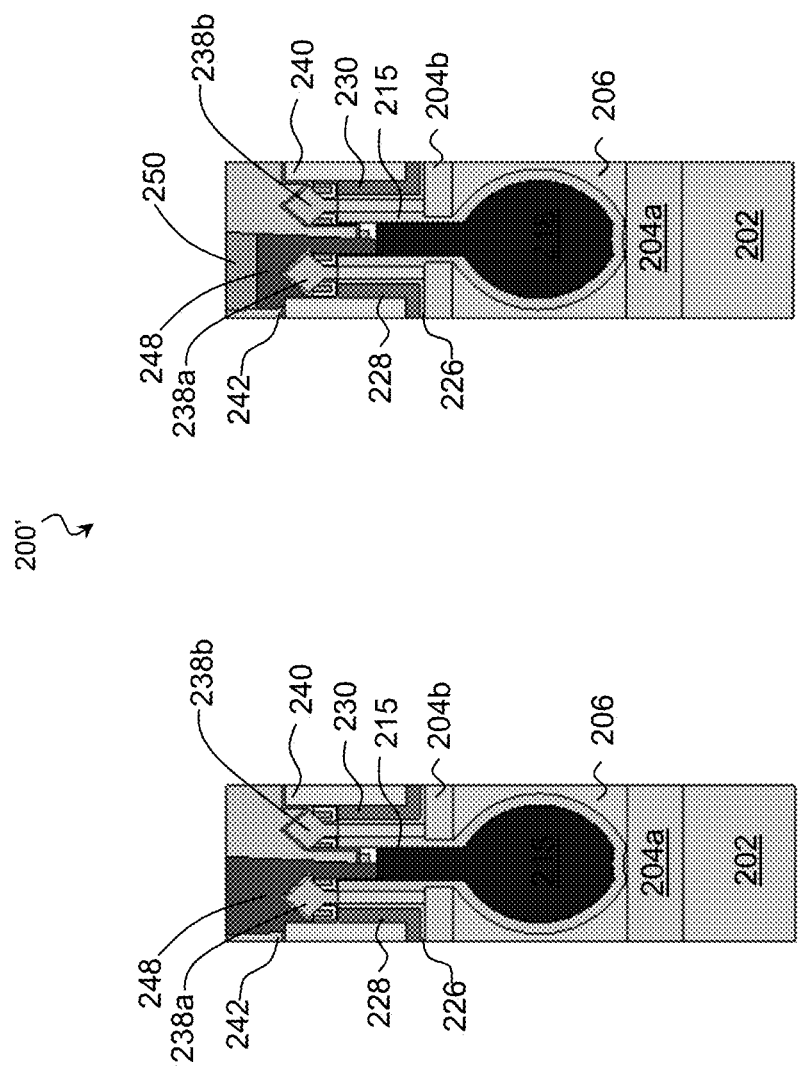

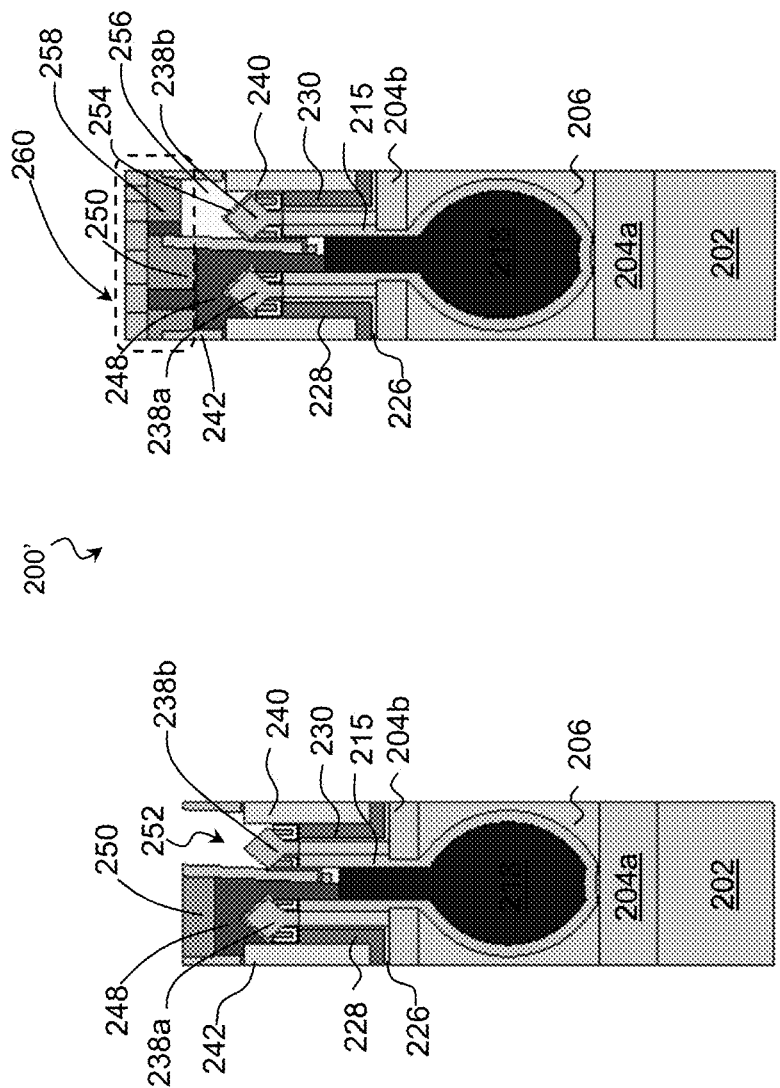

INTEGRATED CIRCUITS WITH BACKSIDE POWER RAILS

PRIORITY DATA

This is a divisional application of U.S. patent application Ser. No. 16/427,831, filed May 31, 2019, which is herein incorporated by reference in its entirety.

BACKGROUND

The semiconductor industry has progressed into nanometer technology process nodes in pursuit of higher device density, higher performance, and lower cost. Beyond merely shrinking devices, circuit designers are looking to novel structures to deliver even greater performance. One avenue of inquiry is the development of three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

To electrically couple the FinFETs and other devices, an integrated circuit may include an interconnect structure with one or more layers of conductive lines electrically coupled to the devices. The overall circuit size and performance may depend on the number and size of the conductive lines as well as the circuit devices and there is limited space for conductive lines.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D, and 1E are flow diagrams of a method of fabricating an integrated circuit workpiece with buried conductive lines according to various aspects of the present disclosure.

FIGS. 2a, 3a, 4a, 5a, 6a, 7a, 8a, 9a, 10a, 11a, 12a, 13a, 14a, 15a, 16a, 17a, 18a, 19a, 20a, 21a, 22a, 23a, 24a, 25a, 26a, 27a, 28a, 29a, 30a, and 31a are perspective/cross-sectional illustrations of a workpiece undergoing a method of fabrication according to various aspects of the present disclosure.

FIGS. 2b, 3b, 4b, 4c, 5b, 6b, 7b, 8b, 9b, 10b, 11b, 12b, 13b, 14b, 15b, 16b, 17b, 18b, 19b, 20b, 21b, 22b, 23b, 24b, 25b, 26b, 27b, 28b, 29b, 30b, and 31b are perspective/cross-sectional illustrations of another workpiece undergoing a method of fabrication according to various aspects of the present disclosure.

FIG. 32a is a cross-sectional illustration of a power rail structure formed according to the method illustrated in FIGS. 1A-1E, according to various aspects of the present disclosure.

DETAILED DESCRIPTION

Figure 1A:
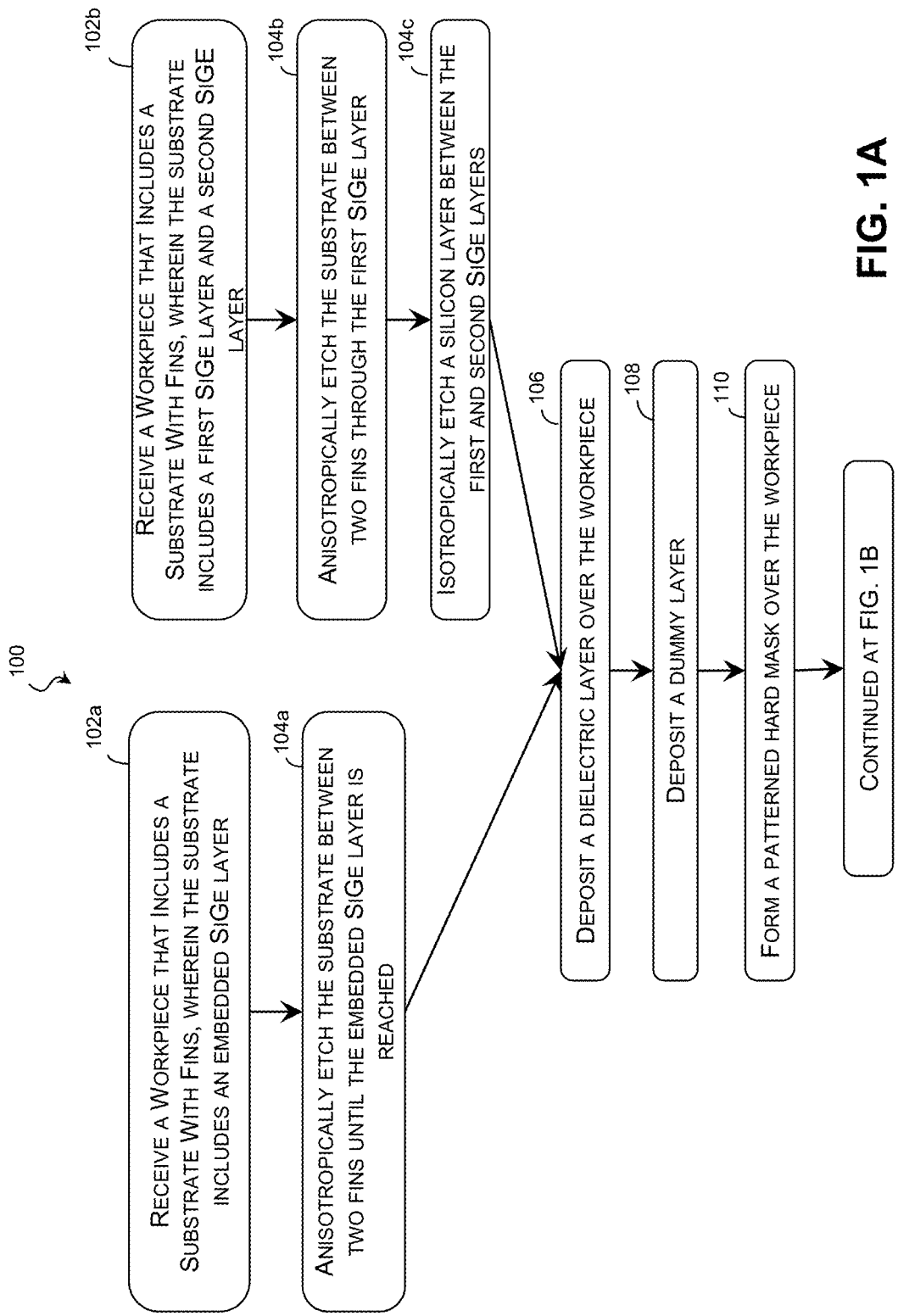

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Advances in fabrication have reduced the sizes of transistors and other active devices that make up an integrated circuit, and as the device sizes are reduced, the corresponding integrated circuits may become wire-bound. In other words, the circuit size may depend on the conductive lines in an interconnect structure that electrically couples the circuit devices rather than on the sizes of the devices themselves. While the thickness of the conductive lines may be reduced to pack more lines in the interconnect, thinner lines have a higher resistance, making them slower and more of a load on the driving device. Likewise, reducing the spacing between lines increases the risk of shorts, noise interference, and capacitive coupling, which may increase the load on the driver. Additional layers of conductive lines may be added to the interconnect structure, but routing on these layers may take additional vias, which have an associated resistance and pose inter-layer alignment issues. Alignment errors tend to compound with each additional interconnect layer, adding yield risk as the number of layers grows.

As described below, the present disclosure provides a technique to relieve some interconnect congestion by providing conductive lines below the transistors. For example, in a FinFET circuit, interconnect lines may be formed below or at least partially buried under the transistor portions of the fins. These lines may be used to carry signals between devices or provide power and/or ground rails. In some examples, the buried conductive lines or conductors act as buried power rails (BPRs). In some instances, because the buried power rails are thicker and have lower resistance than the interconnector layer (which may be referred to as M0) overlying the transistors, the buried power rails may be referred to as super power rails (SPRs). In these examples and others, the buried interconnect lines provide additional routing resources, which may be used to reduce the circuit area, increase circuit density, relieve routing congestion, and/or decrease routing density in the remainder of the interconnect. Additionally, because the BPRs or SPRs can be electrically coupled to M0 via multiple contact vias, M0 can be formed with lower density or smaller dimensions to reduce interference and capacitance coupling while avoiding voltage drop across the span of M0. It is noted, however, unless otherwise noted, no embodiment is required to provide any particular advantage.

Examples of an integrated circuit including a buried conductive line and a technique for forming the conductive line are described with reference to FIGS. 1A-1E, 2a-32a, and 2b-32b. In that regard, FIGS. 1A-1E are flow diagrams of a method 100 of fabricating an integrated circuit (IC) workpiece 200 or an integrated circuit workpiece 200' with buried conductive lines according to various aspects of the present disclosure. Additional steps can be provided before, during, and after the method 100, and some of the steps described can be replaced or eliminated for other embodiments of the method 100. FIG. 2a is a perspective illustration of the workpiece 200 and FIGS. 3a-31a are cross-sectional illustrations along section A-A' of the workpiece 200 in FIG. 2a undergoing the method 100 of fabrication according to various aspects of the present disclosure. FIG. 2b is a perspective illustration of the workpiece 200' and FIGS. 3b-31b are cross-sectional illustrations along section A-A' of the workpiece 200' in FIG. 2b undergoing the method 100 of fabrication according to various aspects of the present disclosure. Section A-A' is perpendicular to the direction at which fins (such as fins 208a and 208b in FIGS. 2a and 2b) extend. FIG. 32a illustrates a cross-sectional view of a portion of the IC workpiece 200. FIG. 32b illustrates a cross-sectional view of a portion of the IC workpiece 200'. Throughout the various views and illustrative embodiments, like reference numbers are used to designate like elements.

Figure 2A:
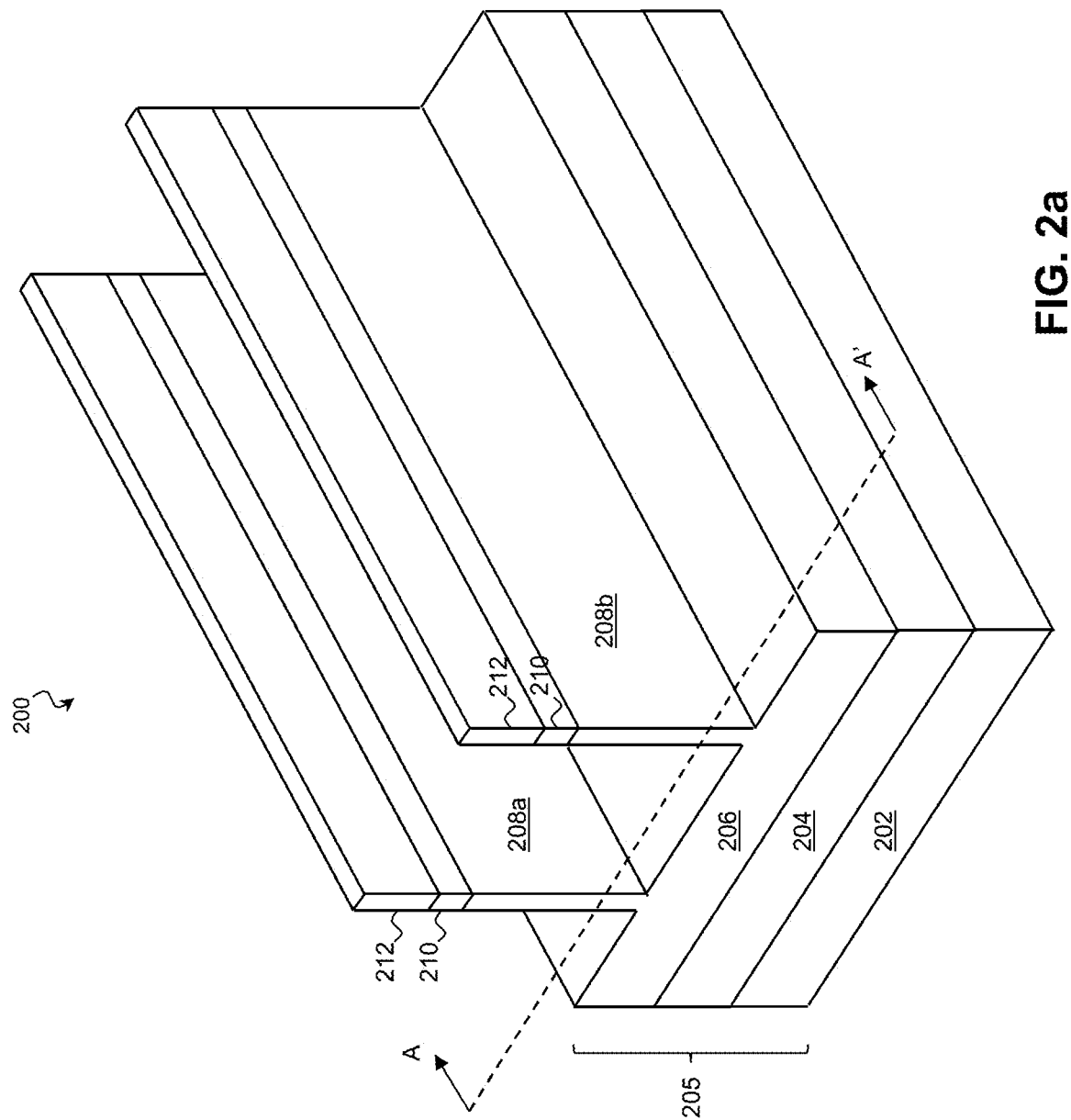
Figure 2B:
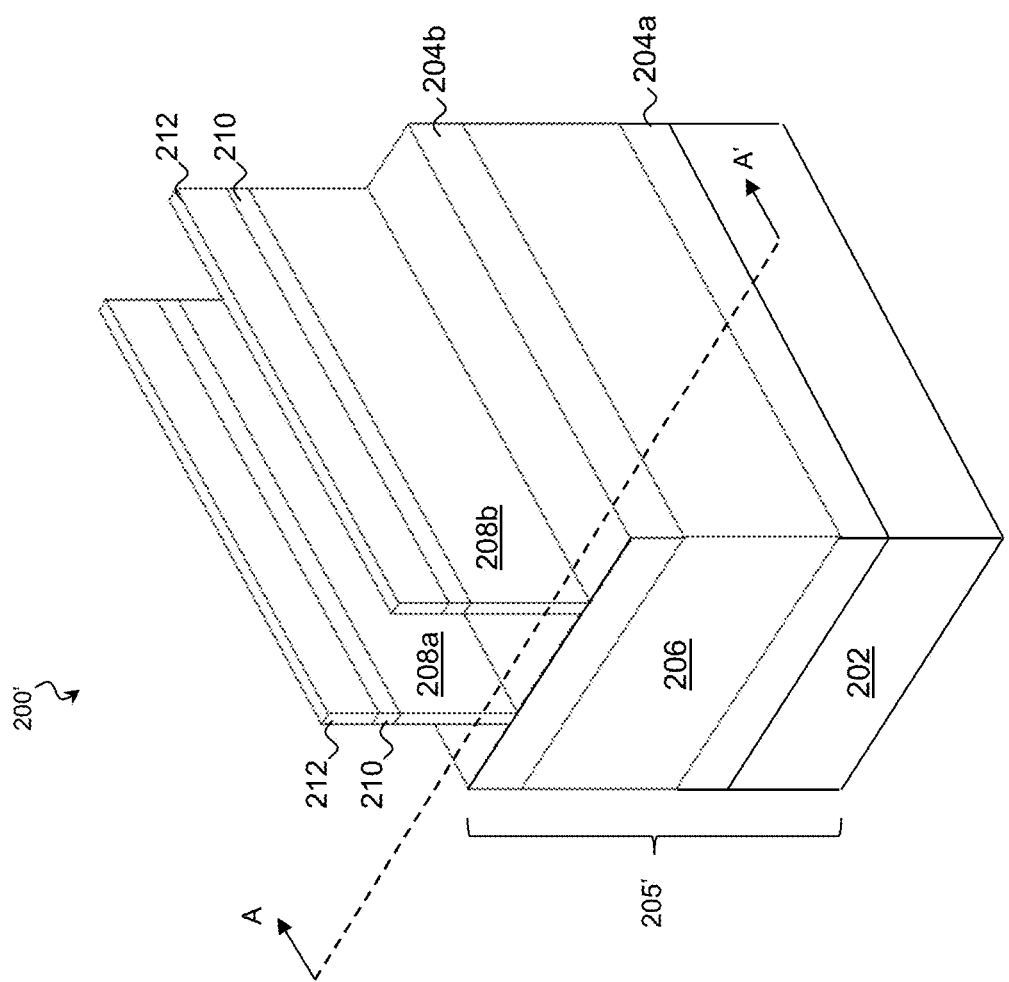

Referring to block 102a of FIG. 1A and to FIG. 2a, the workpiece 200 is received. The workpiece 200 includes a substrate 205 upon which devices are to be formed. In various examples, the substrate 205 includes a first semiconductor layer 202, a second semiconductor layer 204 over the first semiconductor layer 202, and a third semiconductor layer 206 over the second semiconductor layer 204. In some embodiments, each of the first semiconductor layer 202, second semiconductor layer 204 and third semiconductor layer 206 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; and/or combinations thereof. In some embodiments, the second semiconductor layer 204 is epitaxially formed on the first semiconductor layer and the third semiconductor layer 206 is epitaxially formed on the second semiconductor layer 204. In some implementations, the first semiconductor layer 202 and the third semiconductor layer 206 are formed of the same semiconductor material while the second semiconductor layer 204 is formed of a semiconductor material different from that forming the first semiconductor layer 202 and the third semiconductor layer 206. In one embodiment, the second semiconductor layer 204 consists essentially of silicon germanium, and first and third semiconductor layers 202 and 206 consist essentially of silicon. In some instances, the second semiconductor layer 204 consists essentially of silicon germanium (SiGe) with a silicon to germanium ratio between about 8 to 2 (80% Si and 20% Ge) and about 6 to 4 (60% Si and 40% Ge), including about 7 to 3 (70% Si and 30% Ge). Because the second semiconductor layer 204 is disposed below the third semiconductor layer 206, the second semiconductor layer 204 is a semiconductor layer buried under the third semiconductor layer 206. In some embodiments, the second semiconductor layer 204 includes a thickness between about 10 nm and about 50 nm. In some instances, the second semiconductor layer 204 is 40 nm thick.

The third semiconductor layer 206 may be uniform in composition or may include various layers, some of which may be selectively etched to form the fins 208a and 208b in FIG. 2a. The layers may have similar or different compositions, and in various embodiments, some substrate layers have non-uniform compositions to induce device strain and thereby tune device performance. In some examples, the devices to be formed on the third semiconductor layer 206 extend out of the third semiconductor layer 206. For example, FinFETs and/or other non-planar devices may be formed on device fins 208a and 208b disposed on the third semiconductor layer 206. The fins 208a and 208b may be similar in composition to the third semiconductor layer 206 or may be different therefrom. For example, in some embodiments, the third semiconductor layer 206 may include primarily silicon, while the fins 208a and 208b include one or more layers that are primarily germanium or a SiGe semiconductor. In some other embodiments, the third semiconductor layer 206 may include primarily silicon and the fins 208a and 208b also primarily include silicon.

The fins 208a and 208b may be formed by etching portions of the third semiconductor layer 206, by depositing various layers on the third semiconductor layer 206 and etching the layers, and/or by other suitable techniques. For example, the fins 208a and 208b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 208a and 208b and one or more fin-top hard mask layers (e.g., fin-top hard mask layers 210 and 212). The sacrificial layer is patterned using a photolithography process. Spacers are formed alongside the patterned sacrificial layer using a self-aligned process. The sacrificial layer is then removed, and the remaining spacers are used to pattern the fins 208a and 208b by removing material of the fin-top hard mask layers 210 and 212 over fins 208a and 208b that is not covered by the spacers.

The fin-top hard mask layers 210 and 212 may be used to control the etching process that defines the fins 208a and 208b and may protect the fins 208a and 208b during subsequent processing. Accordingly, the fin-top hard mask layers 210 and 212 may be selected to have different etch selectivity from the material(s) of the fins 208a/208b and from each other. The fin-top hard mask layers 210 and 212 may include dielectric materials such as semiconductor oxides, semiconductor nitrides, semiconductor oxynitrides, semiconductor carbides, semiconductor carbonitrides, semiconductor oxycarbonitrides, and/or metal oxides.

Referring to block 104a of FIG. 1A and to FIGS. 3a and 4a, the substrate 205 is etched anisotropically to form a trench between the fins 208a and 208b until the second semiconductor layer 204 is reached. In some embodiments, to protect the fins 208a and 208b, a dielectric layer 214 is formed over the third semiconductor layer 206, the fins 208a/208b, and the fin-top hard mask layers 210 and 212. In some embodiments, the dielectric layer 214 is conformally formed over the third semiconductor layer 206, the fins 208a/208b, and the fin-top hard mask layers 210 and 212 using any suitable process, such as Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. The dielectric layer 214 may include a dielectric material such as a semiconductor oxide and in some examples, the dielectric layer 214 includes silicon oxide.

After the dielectric layer 214 is formed, photolithography techniques may be used to pattern an etch mask and the third semiconductor layer 206 may be etched between fins 208a and 208b using the patterned etch mask to form a trench 216 that reaches the second semiconductor layer 204 or stops somewhere in the second semiconductor layer 204. In the embodiments represented in FIG. 4a, the trench 216 stops right at a top surface of the second semiconductor layer 204. That is, a bottom surface of the trench 216 is positioned on or in the second semiconductor layer 204. In alternative embodiments, the trench 216 may extend further into the second semiconductor layer 204 but does not extend through the second semiconductor layer 204. The second semiconductor layer 204, being made of a semiconductor material different from that of the third semiconductor layer 206, provides means for detecting whether the anisotropic etching has gone through the third semiconductor layer 206. In implementations where the third semiconductor layer 206 is formed of silicon and the second semiconductor layer 204 is formed of silicon germanium, an etching tool may detect that the second semiconductor layer 204 has been reached when trace of germanium is detected. Alternatively, whether the etch has reached the second semiconductor layer 204 may be detected based on change of etching rate. In some embodiments, the anisotropic etching at block 104a may be formed using suitable etching technique, such as dry etching.

Referring to block 106 of FIG. 1A and to FIG. 5a, a dielectric layer 215 is deposited over the third semiconductor layer 206, fins 208a and 208b, and the trench 216. In some embodiments, the dielectric layer 215 may be similar to the dielectric layer 214 in terms of material and methods of formation and detailed description of the same is not repeated here. In some embodiments, the dielectric layer 215 may include the dielectric layer 214 that is not removed at block 104a. In some embodiments, the dielectric layer 215 is different from the dielectric layer 214 in terms of thickness. In those embodiments, the dielectric layer 215 is thicker than the dielectric layer 214 to protect the fins 208a and 208b during removal of dummy material (shown in FIGS. 8a and 9a).

Referring now to block 108 of FIG. 1A and to FIG. 6a, a dummy material 218 is deposited over the dielectric layer 215. In some embodiments, the dummy material 218 is etched back such that at least a portion of the fins 208a and 208b protrude from a top surface of the dummy material 218. In some implementations, the dummy material 218 may be formed of silicon oxide ($SiO_x$), silicon nitride ($SiN_y$), silicon carbonitride, silicon oxycarbonitride, aluminum oxide ($Al_2O_3$), zirconium oxide, or other suitable metal oxide. In one embodiment, the dummy material 218 is formed of aluminum oxide.

Referring to block 110 of FIG. 1A and to FIGS. 7a and 8a, a patterned hard mask 221 (shown in FIG. 8a) is formed. In some embodiment, a hard mask layer 220 is deposited over the workpiece 200, including over the dielectric layer 215 and the dummy material 218. In some embodiments, a photoresist material is deposited over the hard mask layer 220 using a suitable deposition method, such as spin-on coating. Then the deposited photoresist material is exposed to radiation through a transmissive mask or reflected by a reflective mask. The exposed photoresist material may undergo physical changes that allow the exposed photoresist material or the unexposed photoresist material to be selectively removed by a developer. In some embodiments, after the developed photoresist material is baked in a post baking process, the patterned photoresist layer 222 is formed. In subsequent process, the hard mask layer 220 and the dielectric layer 215 under the hard mask layer 220 may be etched using the patterned photoresist layer 222 as an etch mask to form a patterned hard mask 221. As shown in FIG. 8a, upon conclusion of operations in block 110, the portion of the hard mask layer 220 and the dielectric layer 215 that is not covered by the patterned photoresist 222 is removed, exposing a portion of the hard masks 210 and 212 and the fins 208a and 208b. In some embodiments, hard mask layer 220 and the dielectric layer 215 are formed of different dielectric materials. In one embodiment, the hard mask layer 220 is formed of carbon-doped silicon oxide or silicon nitride while the dielectric layer 215 is formed of silicon oxide.

Figure 1B:
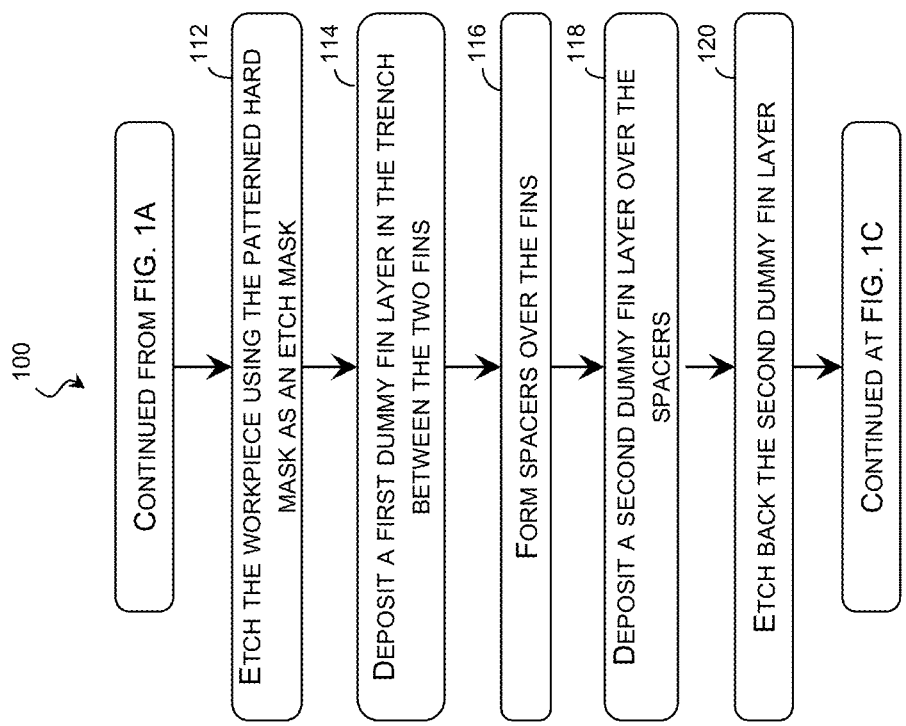

Referring to block 112 of FIG. 1B and FIG. 9a, the workpiece 200 is etched using the patterned hard mask 221 as an etch mask to remove dummy material 218 and the dielectric layer 215 that is not covered by the patterned hard mask 221. In some embodiments, the dummy material 218 and the dielectric layer 215 are etched using a suitable etching process. In some implementations, the dummy material 218 and the dielectric layer 215 are etched using diluted hydrofluoric acid (DHF), which preferentially etches silicon oxide or metal oxide, such as aluminum oxide.

Referring now to block 114 of FIG. 1B and FIG. 10a, a first dummy fin layer 224 is deposited in the trench 216 (shown in FIG. 9a). In some embodiments, the first dummy fin layer 224 is deposited over the workpiece 200. In these embodiments, the first dummy fin layer 224 may be conformally deposited using suitable processes, such as ALD. In some implementations, the first dummy fin layer 224 may be formed of carbon-doped silicon nitride. After the first dummy fin layer 224 is deposited over the workpiece, the first dummy fin layer 224 that is not deposited within the trench 216 is removed, as shown in FIG. 10a. In some embodiments, the first dummy fin layer 224 is formed of dielectric materials such as semiconductor oxides, semiconductor nitrides, semiconductor oxynitrides, semiconductor carbides, semiconductor carbonitrides, semiconductor oxycarbonitrides, and/or metal oxides.

Figure 11A:
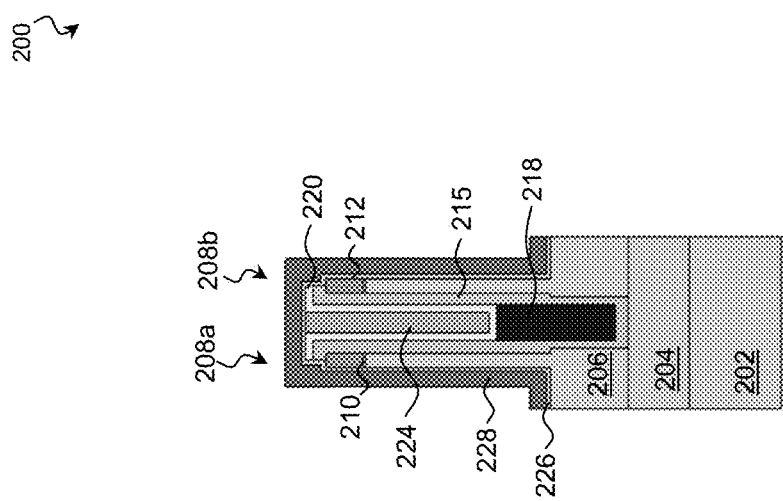

Referring to block 116 of FIG. 1B and FIG. 11a, spacer layers (or spacers) 226 and 228 are formed over the fins 208a and 208b. In some embodiments, the spacer 226 and the spacer 228 are formed of different dielectric materials.

Figure 12A:
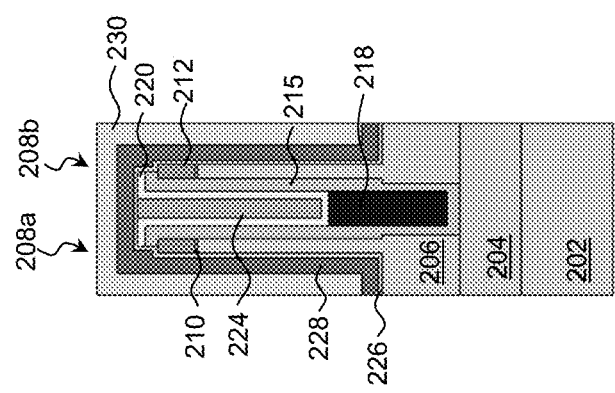

Referring to block 118 in FIG. 1B and FIG. 12a, a second dummy fin layer 230 is deposited over the workpiece 200, including over the spacer 228. The second dummy fin layer 230 may be substantially similar to the first dummy fin layer 224 in terms of material and method of formation and detailed description of the second dummy fin layer 230 will not be repeated here.

Referring to block 120 in FIG. 1B and FIG. 13a, the second dummy fin layer 230 is etched back. In some embodiments, after the second dummy fin layer 230 is etched back, a cap layer 232 is formed to protect the second dummy fin layer 230.

Figure 1C:
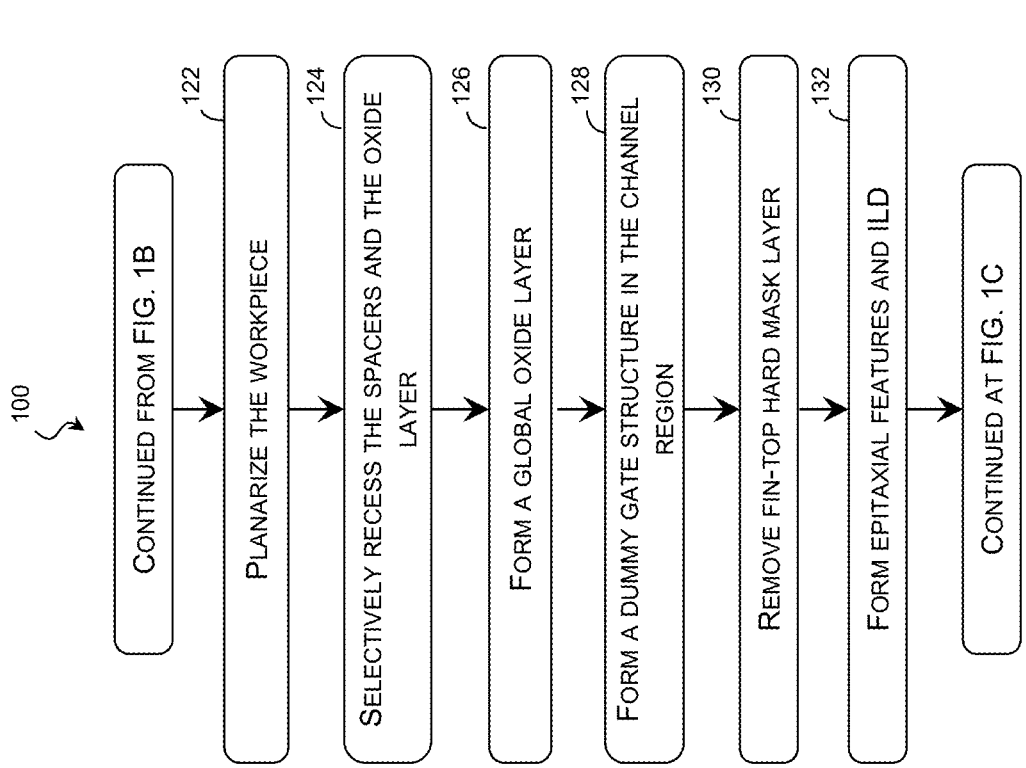

Referring to block 122 in FIG. 1C and FIG. 14a, the workpiece 200 is planarized. In embodiments represented in FIG. 14a, top surfaces of the cap layer 232, spacer 226, spacer 228, fin-top hard mask layer 212, the dielectric layer 215, the hard mask layer 220, and the first dummy fin layer 224 are coplanar. In some implementations, the workpiece 200 is planarized using a suitable planarization technique, such as chemical mechanical polishing (CMP).

Referring to block 124 in FIG. 1C and FIG. 15a, the spacers 226 and 228, the dielectric layer 215, and the hard mask layer 220 are selectively etched such that fins 208a and 208b and dummy fins formed of the first dummy fin layer 224 and the second dummy fin layer 230 protrude from top surfaces of the spacers 226 and 228, the dielectric layer 215, and the hard mask layer 220. In some embodiments, the selective etching at block 124 may be performed using a suitable etching method, such as dry etching.

Referring to block 126 in FIG. 1C and FIG. 16a, a global oxide layer 234 is formed over the workpiece 200, including over fin 208a, fin 208b, and dummy fins formed of the first dummy fin layer 224 and the second dummy fin layer 230. In instances, the global oxide layer 234 functions as an extra dielectric layer for input/output (I/O) nodes and when this extra dielectric layer is not needed for some other nodes, they can be removed.

Referring to block 128 in FIG. 1C and FIG. 17a, a dummy gate structure 236 is formed in channel regions of the fins 208a and 208b. In some embodiments, the dummy gate structure 236 includes a dummy gate dielectric layer and a dummy electrode. In some implementations, the dummy gate dielectric layer may include silicon oxide or other suitable dielectric material and the dummy electrode may include polysilicon. In some instances, one or more sidewall spacers or liners may be formed over the dummy gate structure 236.

Referring to block 130 in FIG. 1C and FIG. 18a, the fin-top hard mask layers 210 and 212 over source/drain regions of the fins 208a and 208b are removed and the dummy fin in the source/drain region of the fins 208 (which is formed from the first dummy fin layer 224 and not protected by any mask layers or cap layers) is also etched back at block 130. Upon conclusion of the operations at block 130, the fins 208a and 208b are exposed in the source/drain region. It is noted that at block 130, the channel regions of fins 208a and 208b, including the fin-top hard mask layers 210 and 212, are covered by the dummy gate structure 236.

Referring to block 132 in FIG. 1C and FIG. 19a, epitaxial features 238a and 238b and an interlayer dielectric (or interlevel dielectric, ILD) 242 are formed. In some embodiments, devices of different conductivity types are formed over the fins 208a and 208b. For example, an N-type FinFET may be formed over the fin 208a and a P-type FinFET may be formed over the fin 208b and vice versa. Epitaxial features 238a and 238b may be epitaxially formed to wrap around the fins 208a and 208b, respectively. In some implementations, epitaxial features 238a and 238b may be formed using suitable epitaxy processes, such as vapor-phase epitaxy (VPE), molecular beam epitaxy, or combinations thereof. In embodiments where an N-type FinFET is to be formed over the fin 208a and a P-type FinFET is to be formed over the fin 208b, epitaxial feature 238a may be formed of silicon doped in-situ with an N-type dopant, such as phosphorous and epitaxial feature 238b may be formed of silicon germanium doped in-situ with a P-type dopant, such as boron. In those embodiments, epitaxial features 238a and 238b are formed sequentially. For example, when epitaxial feature 238a is being formed over the source/drain region of the fin 208a, the source/drain region of the fin 208b is masked. Similarly, when epitaxial feature 238b is being formed over the source/drain region of the fin 208b, the source/drain region of the fin 208a is masked. In some implementations shown in FIG. 19a, after the epitaxial features 238a and 238b are formed, an etch stop layer (ESL) 240 may be formed over the source/drain regions of the fins 208a and 208b, including over the epitaxial features 238a and 238b. ESL 240 may be formed of doped or undoped silicon nitride or other suitable dielectric material. Subsequently, the ILD 242 may be deposited over the workpiece 200. In some instances, the ILD 242 may be formed of silicon oxide, silicon nitride, silicon oxynitride, TEOS formed oxide, PSG, BPSG, low-k dielectric material, other suitable dielectric material, or combinations thereof.

Referring to block 134 in FIG. 1D and FIG. 20a, a trench 244 is formed to expose the epitaxial feature 238a and a portion of the dummy material 218. In some embodiments, a lithography process is performed to form a patterned mask and the patterned mask is used to recess the ILD 242 and form the trench 244. In some implementations illustrated in FIG. 20a, the trench 244 exposes the epitaxial feature 238a and at least a portion of the dummy material 218 between the fins 208a and 208b. In some instances, the recess is performed using a suitable etching process, such as dry etching.

Referring to block 136 in FIG. 1D and FIGS. 21a and 22a, a first source/drain contact 248 is formed over epitaxial feature 238a and in contact with the dummy material 218. In some embodiments, a silicide 246 is formed on the epitaxial feature 238a before the first source/drain contact 248 is formed. To form the silicide 246, a metal precursor, such as titanium, is deposited over the exposed epitaxial feature 238a and an anneal is performed to bring about reaction between the metal precursor and silicon in the epitaxial feature 238a so as to form titanium silicide. In these embodiments, after the silicide 246 is formed, a source/drain contact metal, such as tungsten or ruthenium is deposited in the trench 244 to form the first source/drain contact 248. Additionally, in these embodiments, the first source/drain contact 248 is electrically coupled to the silicide 246 and is in physical contact with the dummy material 218. In some implementations, after the source/drain contact metal is deposited, a planarization process, such as CMP, is performed to remove excess source/drain contact metal over the ILD 242. In some instances, to protect the integrity of the first source/drain contact 248, a dielectric cap 250 is formed over the first source/drain contact 248. In some implementations, the dielectric cap 250 may be formed using a self-alignment process and may be referred to as a self-aligned dielectric cap 250.

Referring to block 138 in FIG. 1D and FIGS. 23a and 24a, a trench 252 is formed to expose the epitaxial feature 238b and a second source/drain contact 256 is formed with the trench 252 over the epitaxial feature 238b. The formation process of the second source/drain contact 256 is similar to that of the first source/drain contact 248. Lithography is used to form a trench 252 to expose the epitaxial feature 238b. As illustrated in FIG. 23a, unlike the trench 244, the trench 252 does not expose the dummy material 218. In some embodiments, after the trench 252 is formed, a metal precursor, such as nickel or cobalt, is deposited over the exposed epitaxial feature 238b and an anneal is performed to bring about reaction between the metal precursor and silicon in the epitaxial feature 238b to form silicide 254. In these embodiments, after the silicide 254 is formed, a source/drain contact metal, such as tungsten or ruthenium is deposited in the trench 252 to form the second source/drain contact 256. Additionally, in these embodiments, the second source/drain contact 256 is electrically coupled to the silicide 254. In some implementations, after the source/drain contact metal is deposited, a planarization process, such as CMP, is performed to remove excess source/drain contact metal over the ILD 242. In some instances, to protect the integrity of the second source/drain contact 256, a dielectric cap 258 is formed over the second source/drain contact 256.

In some examples, the dummy gate structure 236 may be replaced with a gate structure in a gate replacement process. In the gate replacement process, ILD 242 and any hard mask layer over the dummy gate structure 236 is removed to form an opening, where a top surface of the dummy gate structure 236 is exposed. An etch process is then performed through the opening to remove the dummy gate structure 236. Then a high-k gate dielectric layer is formed in the channel regions of the fins 208a and 208b. The high-k gate dielectric layer may include, for example, $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In some embodiments, to enhance bonding between the high-k gate dielectric layer and the fins 208a and 208b, an interfacial layer may be formed in the channel regions between the high-k gate dielectric layer is formed. The interfacial layer may include silicon oxide. Subsequent to the formation of the gate dielectric layer, a gate metal is deposited in the opening to form the gate electrode of the gate structure. In some instances, one or more work function layers may be formed over the gate electrode to tune the work function and one or more dielectric layers may be formed over the gate electrode to protect the gate electrode.

In some embodiments, before further operation at block 140 are performed, an interconnect structure 260 may be formed over workpiece 200 after the first and second source/drain contacts 248 and 256 are formed. The interconnect structure 260 may include multiple dielectric layers and metal conductive layers.

Figure 25A:
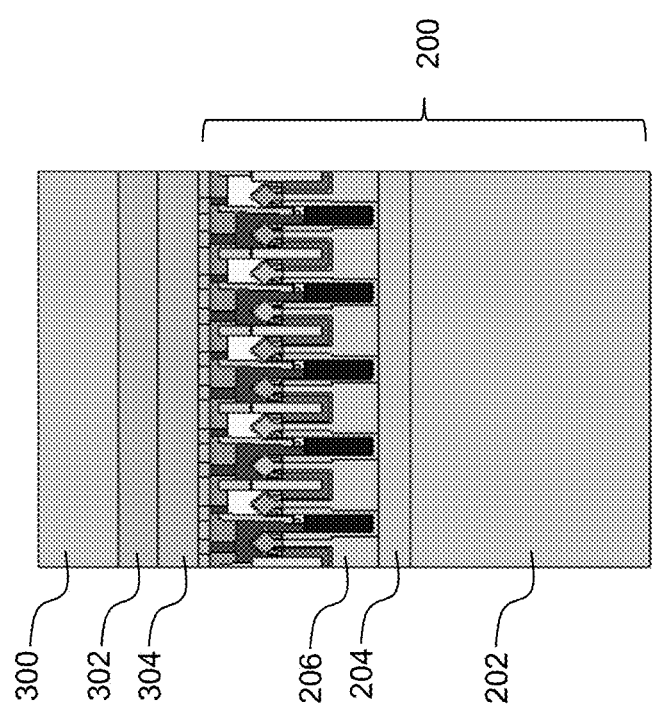

Referring to block 140 in FIG. 1D and FIG. 25a, the workpiece 200 is flipped over and bonded to a carrier wafer 300. In some embodiments, the workpiece 200 is bonded to the carrier wafer 300 using dielectric-to-dielectric bonding. In these embodiments, an oxide layer 304 is formed over the first and second source/drain contacts 248 and 256 (or the interconnect structure 260) and another oxide layer 302 is formed over the carrier wafer 300. Subsequent to the formation of the oxide layers 302 and 304, the workpiece 200, along with the oxide layer 304, is flipped over and placed over the carrier wafer 300 such that the oxide layer 302 is in contact with the oxide layer 304. An anneal is performed to bond the oxide layers 302 and 304 such that the workpiece 200 is bonded to the carrier wafer 300.

Figure 26A:
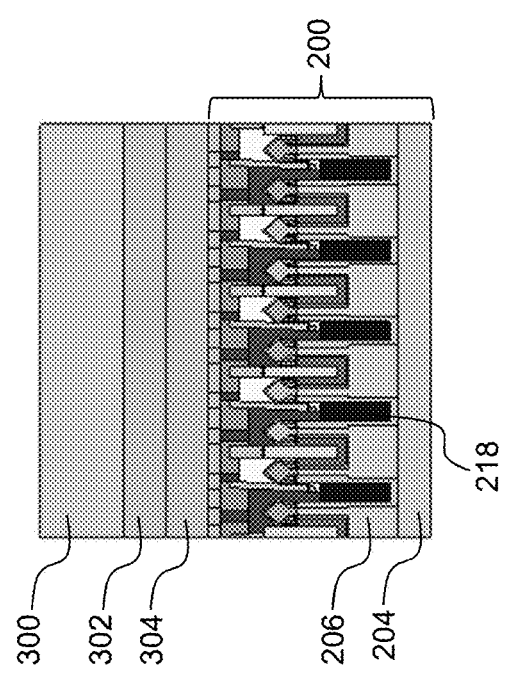

Referring to block 142 in FIG. 1D and FIG. 26a, the workpiece 200 is thinned from the first semiconductor layer 202 until the second semiconductor layer 204 is reached/exposed. In some embodiments, the workpiece 200 is thinned using a planarization technique, such as CMP to remove the first semiconductor layer 202. In these embodiments, the differences in composition and resistance to planarization between the first and second semiconductor layers 202 and 204 may be used to monitor the progress of planarization process and provide control of the planarization of the workpiece 200.

Figure 1E:
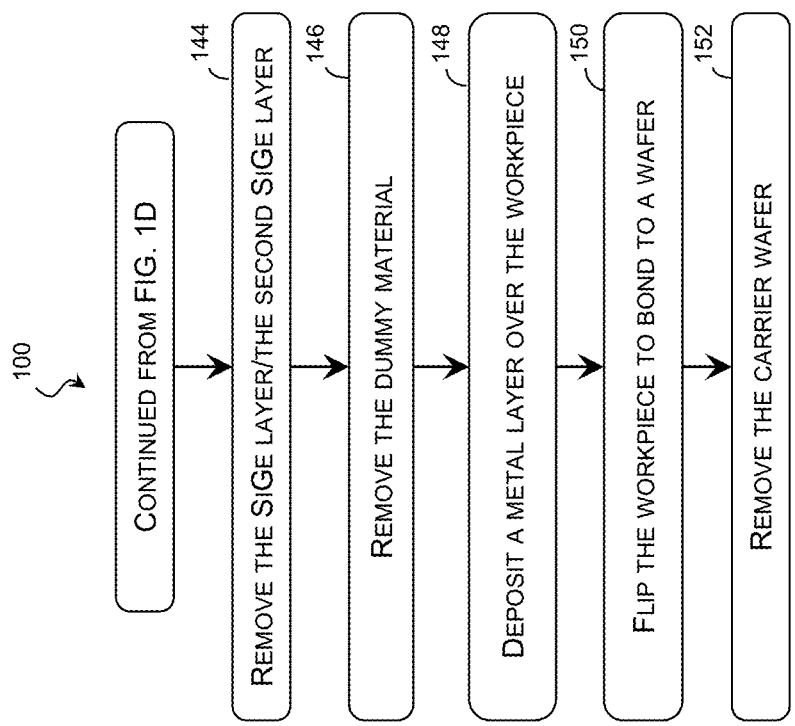
Figure 27A:
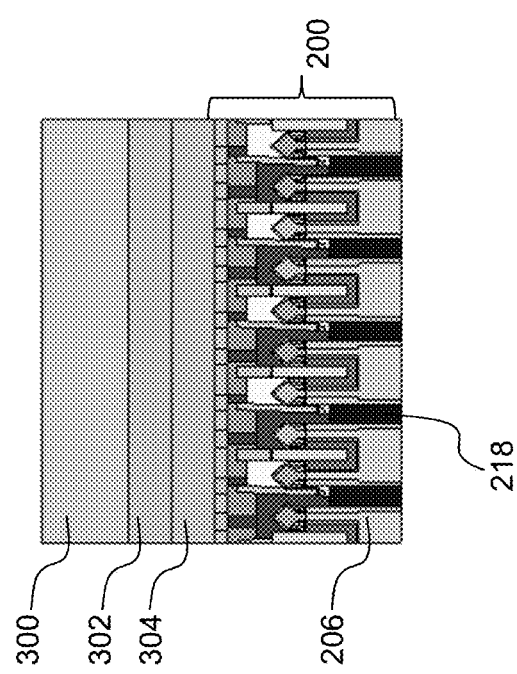

Referring to block 144 in FIG. 1E and FIG. 27a, the second semiconductor layer 204 is removed to expose the dummy material 218. In some embodiments, the second semiconductor layer 204 may be removed using a suitable planarization technique, such as CMP. As illustrated in FIG. 27a, after the planarization of the workpiece 200 at block 144, the dummy material 218 in the third semiconductor layer 206 is exposed.

Figure 28A:
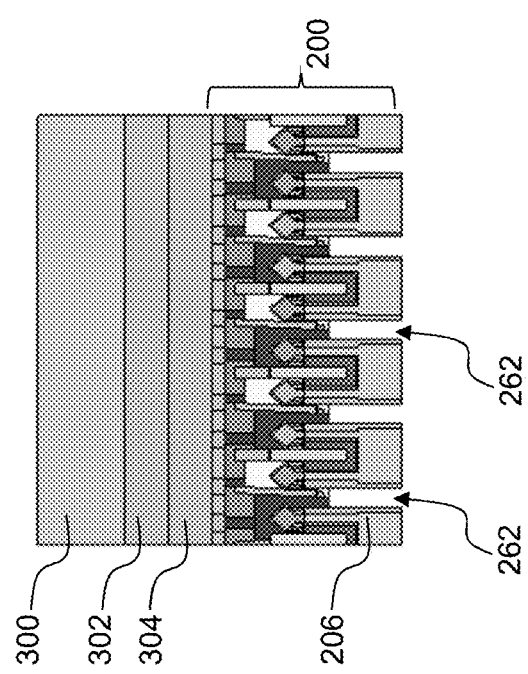

Referring to block 146 in FIG. 1E and FIG. 28a, the dummy material 218 is removed. In some embodiments, the dummy material 218 exposed at block 144 is removed by suitable etching techniques to form trenches 262. For example, the exposed dummy material 218 may be etched using diluted hydrofluoric acid.

Figure 29A:
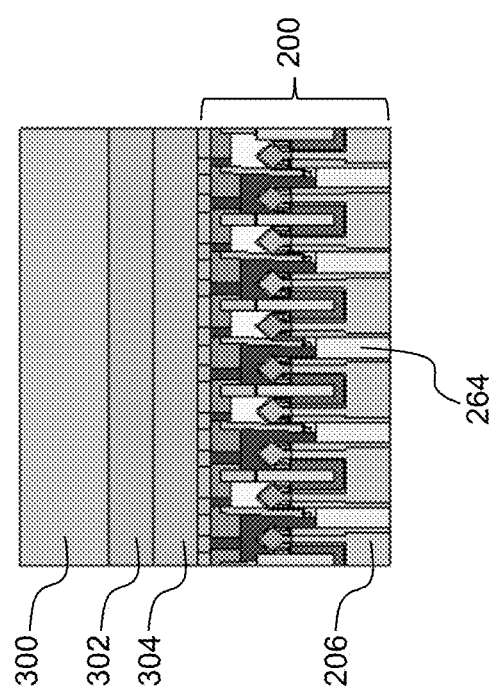

Referring to block 148 in FIG. 1E and FIG. 29a, a metal is deposited over the workpiece 200 to form a metal layer 264. In some embodiments, the metal material is deposited over the workpiece 200, including over and inside the trenches 262. In these embodiments, excess metal outside the trenches 262 may be removed by a suitable planarization technique, such as CMP. The metal to form the metal layer 264 may include copper, tungsten, ruthenium, nickel, cobalt, combinations thereof, or other suitable metals. Because the first source/drain contact 248 is in physical contact with the dummy material 218, after the dummy material 218 is removed and the metal layer 264 is formed, the first source/drain contact 248 is electrically coupled to the metal layer 264. In some embodiments, an interconnect layer overlying the fins 208a and 208b (such as an M0 metal layer) is electrically coupled to a plurality of source/drain contacts, such as the first source/drain contact 248, and therefore electrically coupled to the metal layer 264 through the plurality of source/drain contacts that are spread out through length/width of the workpiece 200. As a result, the metal layer 264 shown in FIG. 29a may be a part of a BPR or SPR that provides conduction paths in additional to M0 metal layer and reduces voltage drop due to resistance of M0 metal layer.

Figure 30A:
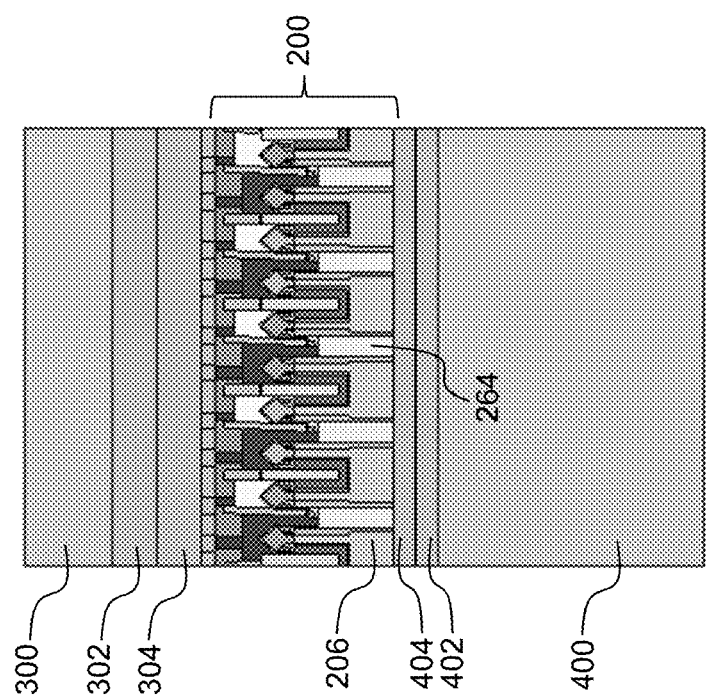

Referring to block 150 in FIG. 1E and FIG. 30a, the workpiece 200 is flipped over and bonded to a wafer 400. In some embodiments, an oxide layer 404 is formed over the metal layer 264 of the workpiece 200 and another oxide layer 402 is formed over the wafer 400. In these embodiments, an anneal is performed to bond the oxide layers 402 and 404 to bond the workpiece 200 on the wafer 400. In some embodiments, the wafer 400 may be a silicon substrate.

Figure 31A:
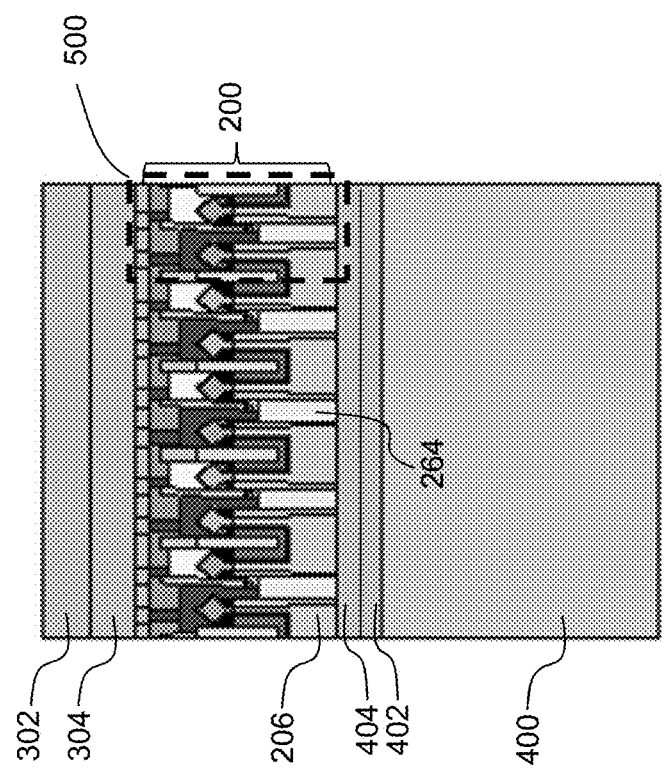
Figure 32B:
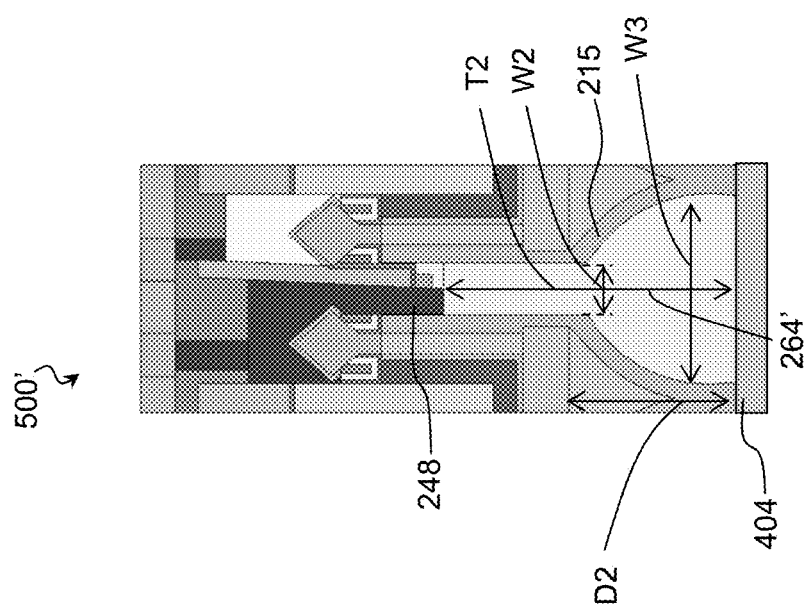
FIG. 32b is a cross-sectional illustration of another power rail structure formed according to the method illustrated in FIGS. 1A-1E, according to various aspects of the present disclosure.

Referring to block 152 in FIG. 1E and FIG. 31a, the carrier wafer 300 is removed from the workpiece 200. In some embodiments, a planarization technique, such as CMP, is used to remove the carrier wafer 300 from the workpiece 200. Further processes may be performed to complete the formation of the IC on the workpiece 200. For example, further metal interconnect structures may be formed over the workpiece 200.

In some examples, the workpiece 200 in FIG. 31a may include a complementary metal oxide semiconductor (CMOS) device 500 and the CMOS device 500 is enlarged and illustrated in FIG. 32a. The CMOS device 500 includes an N-type FinFET, such as one formed over the fin 208a, and a P-type FinFET, such as one formed over the fin 208b. Referring now to FIG. 32a, the CMOS device 500 includes the metal layer 264. In some embodiments, along section A-A', the metal layer 264 in the CMOS device 500 includes a thickness T1 between the first source/drain contact 248 and the oxide layer 402, a width W1, and a penetration depth D1 through the third semiconductor layer 206. In some implementations, T1 is between about 40 nm and about 100 nm; W1 is between about 15 nm and about 25 nm; and D1 is between about 10 nm and about 50 nm.

The IC structure on the workpiece 200 and the method 100 illustrated in FIGS. 1A-1E provide advantages over conventional IC structure and methods. The metal layer 264 positioned between and below the fins 208a and 208b serve as part of a BPR or SPR and provide electrical conduction paths in addition to the interconnect structures over the fins 208a and 208b to reduce resistivity of metal interconnect without area penalty. In fact, because of additional interconnection offered by the metal layer 264, interconnect structures over the fins 208a and 208b can be made smaller while maintaining the same or better interconnection resistivity. By using the dummy material 218 as the placeholder for the metal layer 264 in method 100, the metal layer 264 is subject to less heat cycles and less likely to have spiking, which may deteriorate the quality of electrical conductance in the metal layer 264. Furthermore, the use of the second semiconductor layer 204 in the substrate allows good control of a depth at which the metal layer 264 extends into the substrate 205.

Alternatively and optionally, as shown in FIG. 2b, a workpiece 200' with a substrate 205' different from the substrate 205 in FIG. 2a may be used in method 100 to create an SPR with low resistivity. It is noted that, for ease of illustrate and description of the embodiments, like reference numbers are used to designate like elements.

Referring to block 102b of FIG. 1A and to FIGS. 2b and 3b, the workpiece 200' is received. The workpiece 200' includes a substrate 205' upon which devices are to be formed. In various examples, the substrate 205' includes a first semiconductor layer 202, a second semiconductor layer 204a over the first semiconductor layer 202, a third semiconductor layer 206 over the second semiconductor layer 204a, and a fourth semiconductor layer 204b over the third semiconductor layer 206. In some embodiments, each of the first semiconductor layer 202, second semiconductor layer 204a, the third semiconductor layer 206, and the fourth semiconductor layer 204b includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; and/or combinations thereof. In some embodiments, the second semiconductor layer 204a is epitaxially formed on the first semiconductor layer 202, the third semiconductor layer 206 is epitaxially formed on the second semiconductor layer 204a, and the fourth semiconductor layer 204b is epitaxially formed on the third semiconductor layer 206. In some implementations, the first semiconductor layer 202 and the third semiconductor layer 206 are formed of the same semiconductor material while the second semiconductor layer 204a and the fourth semiconductor layer 204b are formed of a semiconductor material different from that forming the first semiconductor layer 202 and the third semiconductor layer 206. In one embodiment, each of the second semiconductor layer 204a and the fourth semiconductor layer 204b consists essentially of silicon germanium, and first and third semiconductor layers 202 and 206 consist essentially of silicon. In some instances, each of the second semiconductor layer 204a and the fourth semiconductor layer 204b consists essentially of silicon germanium (SiGe) with a silicon to germanium ratio between about 8 to 2 (80% Si and 20% Ge) and about 6 to 4 (60% Si and 40% Ge), including about 7 to 3 (70% Si and 30% Ge). Because the second semiconductor layer 204a is disposed below the third semiconductor layer 206, the second semiconductor layer 204a is a semiconductor layer buried under the third semiconductor layer 206. In some embodiments, the second semiconductor layer 204a includes a thickness between about 10 nm and about 50 nm, such as 40 nm.

The fourth semiconductor layer 204b may include various layers, some of which may be selectively etched to form the fins 208a and 208b in FIG. 2b. The layers may have similar or different compositions, and in various embodiments, some substrate layers have non-uniform compositions to induce device strain and thereby tune device performance. In some examples, the devices to be formed on the fourth semiconductor layer 204b extend out of the fourth semiconductor layer 204b. For example, FinFETs and/or other non-planar devices may be formed on device fins 208a and 208b disposed on the fourth semiconductor layer 204b. The fins 208a and 208b may be similar in composition to the fourth semiconductor layer 204b or may be different therefrom. For example, in some embodiments, the fourth semiconductor layer 204b may include primarily silicon germanium, while the fins 208a and 208b include one or more layers that are primarily silicon. In some other embodiments, the fourth semiconductor layer 204b may include primarily silicon germanium and the fins 208a and 208b also primarily include silicon germanium.

The fins 208a and 208b may be formed by depositing various layers on the fourth semiconductor layer 204b and etching these layers by other suitable techniques. For example, the fins 208a and 208b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the various layers on the fourth semiconductor layer 204b and one or more fin-top hard mask layers (e.g., fin-top hard mask layers 210 and 212). The sacrificial layer is patterned using a photolithography process. Spacers are formed alongside the patterned sacrificial layer using a self-aligned process. The sacrificial layer is then removed, and the remaining spacers are used to pattern the fins 208a and 208b by removing material of the fin-top hard mask layers 210 and 212 over fins 208a and 208b that is not covered by the spacers.

The fin-top hard mask layers 210 and 212 may be used to control the etching process that defines the fins 208a and 208b and may protect the fins 208a and 208b during subsequent processing. Accordingly, the fin-top hard mask layers 210 and 212 may be selected to have different etch selectivity from the material(s) of the fins 208a/208b and from each other. The fin-top hard mask layers 210 and 212 may include dielectric materials such as semiconductor oxides, semiconductor nitrides, semiconductor oxynitrides, semiconductor carbides, semiconductor carbonitrides, semiconductor oxycarbonitrides, and/or metal oxides.

In some embodiments, to protect the fins 208a and 208b, a dielectric layer 214 is formed over the fourth semiconductor layer 204b, the fins 208a/208b, and the fin-top hard mask layers 210 and 212, as shown in FIG. 4b. In some embodiments, the dielectric layer 214 is conformally formed over the fourth semiconductor layer 204b, the fins 208a/208b, and the fin-top hard mask layers 210 and 212 using any suitable process, such as ALD, PEALD, CVD, PECVD, HDP-CVD, and/or other suitable deposition processes. The dielectric layer 214 may include a dielectric material such as a semiconductor oxide and in some examples, the dielectric layer 214 includes silicon oxide.

Referring to block 104b of FIG. 1A and to FIG. 4b, the substrate 205' is etched anisotropically to form a trench 216' between the fins 208a and 208b through the fourth semiconductor layer 204b and the dielectric layer 214 such that the third semiconductor layer 206 is exposed between the fins 208a and 208b in the trench 216'. In some embodiments, after the dielectric layer 214 is formed, photolithography techniques may be used to pattern an etch mask and the fourth semiconductor layer 204b may be etched between fins 208a and 208b using the patterned etch mask to form a trench 216' that reaches the third semiconductor layer 206 or stops somewhere in the third semiconductor layer 206. In some embodiments, an anisotropic etching technique, such as drying etching, is used to perform operations at block 104b to form the trench 216'. In some embodiments represented in FIG. 4b, the trench 216' extends into the third semiconductor layer 206 but does not extend through the third semiconductor layer 206. In other embodiments, the trench 216' may terminate at or near the interface between the fourth semiconductor layer 204b and the third semiconductor layer 206. That is, a bottom surface of the trench 216' is positioned on or in the third semiconductor layer 206.

Referring to block 104c of FIG. 1A and to FIG. 4c, the third semiconductor layer 206 is isotropically and selectively etched through the trench 216' to form a widened trench 216" in the third semiconductor layer 206. In some embodiments, a selective etch process may be used to selectively and isotropically etch the third semiconductor layer 206 between the second semiconductor layer 204a and the fourth semiconductor layer 204b, such that the third semiconductor layer 206 is etched laterally between the second and fourth semiconductor layers 204a and 204b. Such a selective etch process may be a wet etch using an alkaline solution, such as ammonia.

In the embodiments represented in FIG. 4c, the widened trench 216" stops at or around a top surface of the second semiconductor layer 204a. In alternative embodiments, the trench 216" may extend into the second semiconductor layer 204a but does not extend through the second semiconductor layer 204a. The second semiconductor layer 204a and the fourth semiconductor layer 204b, being made of a semiconductor material different from that of the third semiconductor layer 206, serve as etch stop layers or etch retardant layers to allow lateral etching in the third semiconductor layer 206 to form the widened trench 216".

Referring to block 106 of FIG. 1A and to FIG. 5b, a dielectric layer 215 is deposited over the third semiconductor layer 206, fins 208a and 208b, and sidewalls of the widened trench 216". In some embodiments, the dielectric layer 215 may be similar to the dielectric layer 214 in terms of material and methods of formation and detailed description of the same is not repeated here. In some embodiments, the dielectric layer 215 may include the dielectric layer 214 that is not removed at blocks 104b and 104c. In some embodiments, the dielectric layer 215 is different from the dielectric layer 214 in terms of thickness. In those embodiments, the dielectric layer 215 is thicker than the dielectric layer 214 to protect the fins 208a and 208b during removal of dummy material (shown in FIGS. 8b and 9b).

Referring now to block 108 of FIG. 1A and to FIG. 6b, a dummy material 218 is deposited over the dielectric layer 215, including into the widened trench 216". In some embodiments, the dummy material 218 is etched back such that at least a portion of the fins 208a and 208b protrude from a top surface of the dummy material 218. In some implementations, the dummy material 218 may be formed of silicon oxide ($SiO_x$), silicon nitride ($SiN_y$), silicon carbonitride, silicon oxycarbonitride, aluminum oxide ($Al_2O_3$), zirconium oxide, or other suitable metal oxide. In one embodiment, the dummy material 218 is formed of aluminum oxide.

Referring to block 110 of FIG. 1A and to FIGS. 7b and 8b, a patterned hard mask 221 (shown in FIG. 8b) is formed. In some embodiment, a hard mask layer 220 is deposited over the workpiece 200', including over the dielectric layer 215 and the dummy material 218. In some embodiments, a photoresist material is deposited over the hard mask layer 220 using a suitable deposition method, such as spin-on coating. Then the deposited photoresist material is exposed to radiation through a transmissive mask or reflected by a reflective mask. The exposed photoresist material may undergo physical changes that allow the exposed photoresist material or the unexposed photoresist material to be selectively removed by a developer. In some embodiments, after the developed photoresist material is baked in a post baking process, the patterned photoresist layer 222 is formed. In subsequent process, the hard mask layer 220 and the dielectric layer 215 under the hard mask layer 220 may be etched using the patterned photoresist layer 222 as an etch mask to form a patterned hard mask 221. As shown in FIG. 8b, upon conclusion of operations in block 110, the portion of the hard mask layer 221 that is not covered by the patterned photoresist 222 is removed, exposing a portion of the hard masks 210 and 212 and the fins 208a and 208b. In some embodiments, hard mask layer 220 and the dielectric layer 215 are formed of different dielectric materials. In one embodiment, the hard mask layer 220 is formed of carbon-doped silicon oxide or silicon nitride while the dielectric layer 215 is formed of silicon oxide.

Referring to block 112 of FIG. 1B and FIG. 9b, the workpiece 200' is etched using the patterned hard mask 221 as an etch mask to remove dummy material 218 and the dielectric layer 215 that is not covered by the patterned hard mask 221. In some embodiments, the dummy material 218 and the dielectric layer 215 are etched using a suitable etching process. In some implementations, the dummy material 218 and the dielectric layer 215 are etched using diluted hydrofluoric acid (DHF), which preferentially etches silicon oxide or metal oxide, such as aluminum oxide.

Referring now to block 114 of FIG. 1B and FIG. 10b, a first dummy fin layer 224 is deposited in the trench 216 (shown in FIG. 9a). In some embodiments, the first dummy fin layer 224 is deposited over the workpiece 200'. In these embodiments, the first dummy fin layer 224 may be conformally deposited using suitable processes, such as ALD. In some implementations, the first dummy fin layer 224 may be formed of carbon-doped silicon nitride. After the first dummy fin layer 224 is deposited over the workpiece 200', the first dummy fin layer 224 that is not deposited within the trench 216 is removed, as shown in FIG. 10b. In some embodiments, the first dummy fin layer 224 is formed of dielectric materials such as semiconductor oxides, semiconductor nitrides, semiconductor oxynitrides, semiconductor carbides, semiconductor carbonitrides, semiconductor oxycarbonitrides, and/or metal oxides.

Referring to block 116 of FIG. 1B and FIG. 11b, spacer layers (or spacers) 226 and 228 are formed over the fins 208a and 208b. In some embodiments, the spacer 226 and the spacer 228 are formed of different dielectric materials.

Referring to block 118 in FIG. 1B and FIG. 12b, a second dummy fin layer 230 is deposited over the workpiece 200', including over the spacer 228. The second dummy fin layer 230 may be substantially similar to the first dummy fin layer 224 in terms of material and method of formation and detailed description of the second dummy fin layer 230 will not be repeated here.

Referring to block 120 in FIG. 1B and FIG. 13b, the second dummy fin layer 230 is etched back. In some embodiments, after the second dummy fin layer 230 is etched back, a cap layer 232 is formed to protect the second dummy fin layer 230.

Referring to block 122 in FIG. 1C and FIG. 14b, the workpiece 200' is planarized. In embodiments represented in FIG. 14b, top surfaces of the cap layer 232, spacer 226, spacer 228, fin-top hard mask layer 212, the dielectric layer 215, the hard mask layer 220, and the first dummy fin layer 224 are coplanar. In some implementations, the workpiece 200' is planarized using a suitable planarization technique, such as chemical mechanical polishing (CMP).

Figures 15B, 16B:
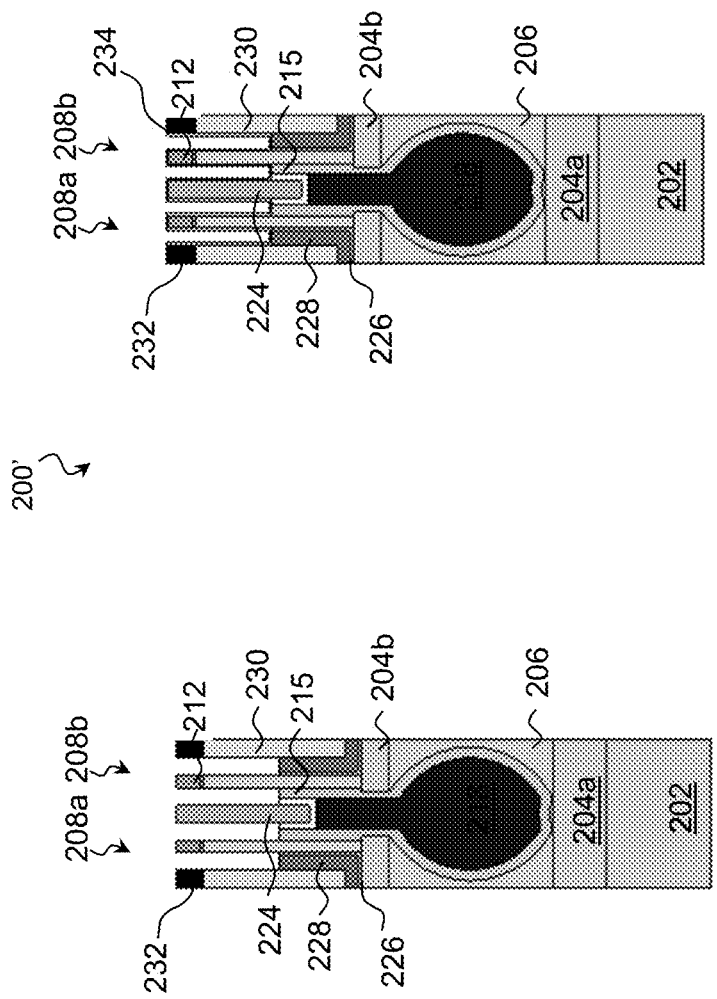

Referring to block 124 in FIG. 1C and FIG. 15b, the spacers 226 and 228, the dielectric layer 215, and the hard mask layer 220 are selectively etched such that fins 208a and 208b and dummy fins formed of the first dummy fin layer 224 and the second dummy fin layer 230 protrude from top surfaces of the spacers 226 and 228, the dielectric layer 215, and the hard mask layer 220. In some embodiments, the selective etching at block 124 may be performed using a suitable etching method, such as dry etching.

Referring to block 126 in FIG. 1C and FIG. 16b, a global oxide layer 234 is formed over the workpiece 200', including over fin 208a, fin 208b, and dummy fins formed of the first dummy fin layer 224 and the second dummy fin layer 230. In instances, the global oxide layer 234 functions as an extra dielectric layer for input/output (I/O) nodes and when this extra dielectric layer is not needed for some other nodes, they can be removed.

Referring to block 128 in FIG. 1C and FIG. 17b, a dummy gate structure 236 is formed in channel regions of the fins 208a and 208b. In some embodiments, the dummy gate structure 236 includes a dummy gate dielectric layer and a dummy electrode. In some implementations, the dummy gate dielectric layer may include silicon oxide or other suitable dielectric material and the dummy electrode may include polysilicon. In some instances, one or more sidewall spacers or liners may be formed over the dummy gate structure 236.

Referring to block 130 in FIG. 1C and FIG. 18b, the fin-top hard mask layers 210 and 212 over source/drain regions of the fins 208a and 208b are removed and the dummy fin in the source/drain region of the fins 208 (which is formed from the first dummy fin layer 224 and not protected by any mask layers or cap layers) is also etched back at block 130. Upon conclusion of the operations at block 130, the fins 208a and 208b are exposed in the source/drain region. It is noted that at block 130, the channel regions of fins 208a and 208b, including the fin-top hard mask layers 210 and 212, are covered by the dummy gate structure 236.

Referring to block 132 in FIG. 1C and FIG. 19b, epitaxial features 238a and 238b and an interlayer dielectric (or interlevel dielectric, ILD) 242 are formed. In some embodiments, devices of different conductivity types are formed over the fins 208a and 208b. For example, an N-type FinFET may be formed over the fin 208a and a P-type FinFET may be formed over the fin 208b and vice versa. Epitaxial features 238a and 238b may be epitaxially formed to wrap around the fins 208a and 208b, respectively. In some implementations, epitaxial features 238a and 238b may be formed using suitable epitaxy processes, such as vapor-phase epitaxy (VPE), molecular beam epitaxy, or combinations thereof. In embodiments where an N-type FinFET is to be formed over the fin 208a and a P-type FinFET is to be formed over the fin 208b, epitaxial feature 238a may be formed of silicon doped in-situ with an N-type dopant, such as phosphorous and epitaxial feature 238b may be formed of silicon germanium doped in-situ with a P-type dopant, such as boron. In those embodiments, epitaxial features 238a and 238b are formed sequentially. For example, when epitaxial feature 238a is being formed over the source/drain region of the fin 208a, the source/drain region of the fin 208b is masked. Similarly, when epitaxial feature 238b is being formed over the source/drain region of the fin 208b, the source/drain region of the fin 208a is masked. In some implementations shown in FIG. 19b, after the epitaxial features 238a and 238b are formed, an etch stop layer (ESL) 240 may be formed over the source/drain regions of the fins 208a and 208b, including over the epitaxial features 238a and 238b. ESL 240 may be formed of doped or undoped silicon nitride or other suitable dielectric material. Subsequently, the ILD 242 may be deposited over the workpiece 200'. In some instances, the ILD 242 may be formed of silicon oxide, silicon nitride, silicon oxynitride, TEOS formed oxide, PSG, BPSG, low-k dielectric material, other suitable dielectric material, or combinations thereof.

Referring to block 134 in FIG. 1D and FIG. 20b, a trench 244 is formed to expose the epitaxial feature 238a and a portion of the dummy material 218 in the widened trench 216". In some embodiments, a lithography process is performed to form a patterned mask and the patterned mask is used to recess the ILD 242 and form the trench 244. In some implementations illustrated in FIG. 20b, the trench 244 exposes the epitaxial feature 238a and at least a portion of the dummy material 218 between the fins 208a and 208b. In some instances, the recess is performed using a suitable etching process, such as dry etching.

Referring to block 136 in FIG. 1D and FIGS. 21b and 22b, a first source/drain contact 248 is formed over epitaxial feature 238a and in contact with the dummy material 218. In some embodiments, a silicide 246 is formed on the epitaxial feature 238a before the first source/drain contact 248 is formed. To form the silicide 246, a metal precursor, such as titanium, is deposited over the exposed epitaxial feature 238a and an anneal is performed to bring about reaction between the metal precursor and silicon in the epitaxial feature 238a so as to form titanium silicide. In these embodiments, after the silicide 246 is formed, a source/drain contact metal, such as tungsten or ruthenium is deposited in the trench 244 to form the first source/drain contact 248. Additionally, in these embodiments, the first source/drain contact 248 is electrically coupled to the silicide 246 and is in physical contact with the dummy material 218. In some implementations, after the source/drain contact metal is deposited, a planarization process, such as CMP, is performed to remove excess source/drain contact metal over the ILD 242. In some instances, to protect the integrity of the first source/drain contact 248, a dielectric cap 250 is formed over the first source/drain contact 248. In some implementations, the dielectric cap 250 may be formed using a self-alignment process and may be referred to as a self-aligned dielectric cap 250.

Referring to block 138 in FIG. 1D and FIGS. 23b and 24b, a trench 252 is formed to expose the epitaxial feature 238b and a second source/drain contact 256 is formed with the trench 252 over the epitaxial feature 238b. The formation process of the second source/drain contact 256 is similar to that of the first source/drain contact 248. Lithography is used to form a trench 252 to expose the epitaxial feature 238b. As illustrated in FIG. 23b, unlike the trench 244, the trench 252 does not expose the dummy material 218. In some embodiments, after the trench 252 is formed, a metal precursor, such as nickel or cobalt, is deposited over the exposed epitaxial feature 238b and an anneal is performed to bring about reaction between the metal precursor and silicon in the epitaxial feature 238b to form silicide 254. In these embodiments, after the silicide 254 is formed, a source/drain contact metal, such as tungsten or ruthenium is deposited in the trench 252 to form the second source/drain contact 256. Additionally, in these embodiments, the second source/drain contact 256 is electrically coupled to the silicide 254. In some implementations, after the source/drain contact metal is deposited, a planarization process, such as CMP, is performed to remove excess source/drain contact metal over the ILD 242. In some instances, to protect the integrity of the second source/drain contact 256, a dielectric cap 258 is formed over the second source/drain contact 256.

In some examples, the dummy gate structure 236 may be replaced with a gate structure in a gate replacement process. In the gate replacement process, ILD 242 and any hard mask layer over the dummy gate structure 236 is removed to form an opening, where a top surface of the dummy gate structure 236 is exposed. An etch process is then performed through the opening to remove the dummy gate structure 236. Then a high-k gate dielectric layer is formed in the channel regions of the fins 208a and 208b. The high-k gate dielectric layer may include, for example, HfO$_2$, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, and/or combinations thereof. In some embodiments, to enhance bonding between the high-k gate dielectric layer and the fins 208a and 208b, an interfacial layer may be formed in the channel regions between the high-k gate dielectric layer is formed. The interfacial layer may include silicon oxide. Subsequent to the formation of the gate dielectric layer, a gate metal is deposited in the opening to form the gate electrode of the gate structure. In some instances, one or more work function layers may be formed over the gate electrode to tune the work function and one or more dielectric layers may be formed over the gate electrode to protect the gate electrode.

In some embodiments, before further operation at block 140 are performed, an interconnect structure 260 may be formed over workpiece 200' after the first and second source/drain contacts 248 and 256 are formed. The interconnect structure 260 may include multiple dielectric layers and metal conductive layers.

Figure 25B:
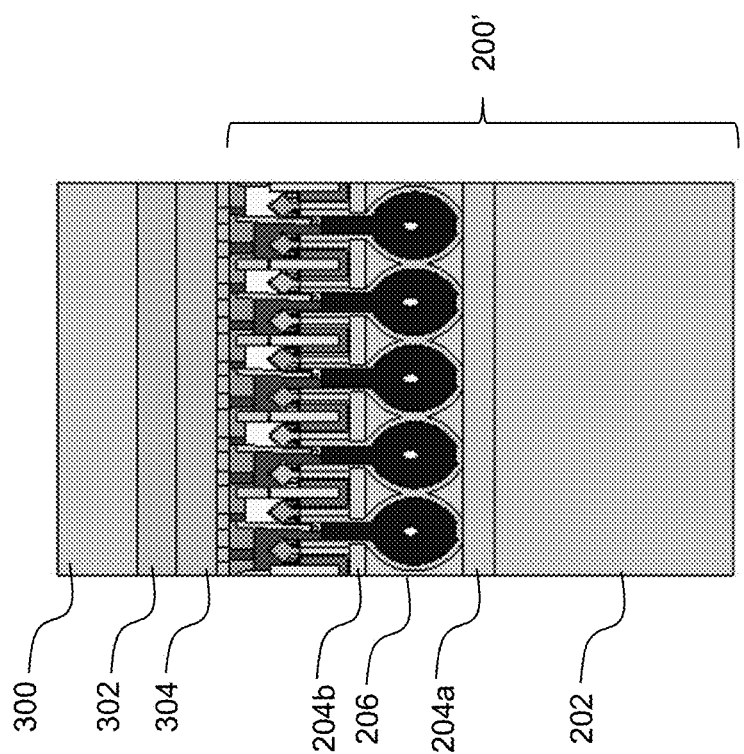

Referring to block 140 in FIG. 1D and FIG. 25b, the workpiece 200' is flipped over and bonded to a carrier wafer 300. In some embodiments, the workpiece 200' is bonded to the carrier wafer 300 using dielectric-to-dielectric bonding. In these embodiments, an oxide layer 304 is formed over the first and second source/drain contacts 248 and 256 (or the interconnect structure 260) and another oxide layer 302 is formed over the carrier wafer 300. Subsequent to the formation of the oxide layers 302 and 304, the workpiece 200', along with the oxide layer 304, is flipped over and placed over the carrier wafer 300 such that the oxide layer 302 is in contact with the oxide layer 304. An anneal is performed to bond the oxide layers 302 and 304 such that the workpiece 200' is bonded to the carrier wafer 300.

Figure 26B:
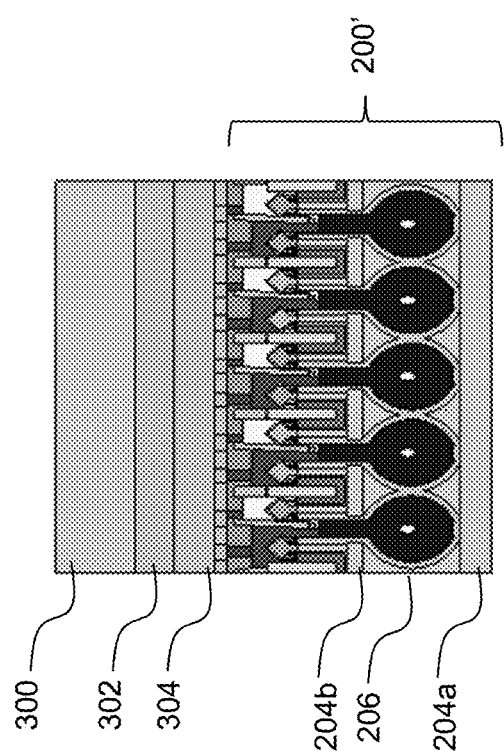

Referring to block 142 in FIG. 1D and FIG. 26b, the workpiece 200' is thinned from the first semiconductor layer 202 until the second semiconductor layer 204a is reached/exposed. In some embodiments, the workpiece 200' is thinned using a planarization technique, such as CMP to remove the first semiconductor layer 202. In these embodiments, the differences in composition and resistance to planarization between the first and second semiconductor layers 202 and 204a may be used to monitor the progress of planarization process and provide control of the planarization of the workpiece 200'.

Figure 27B:
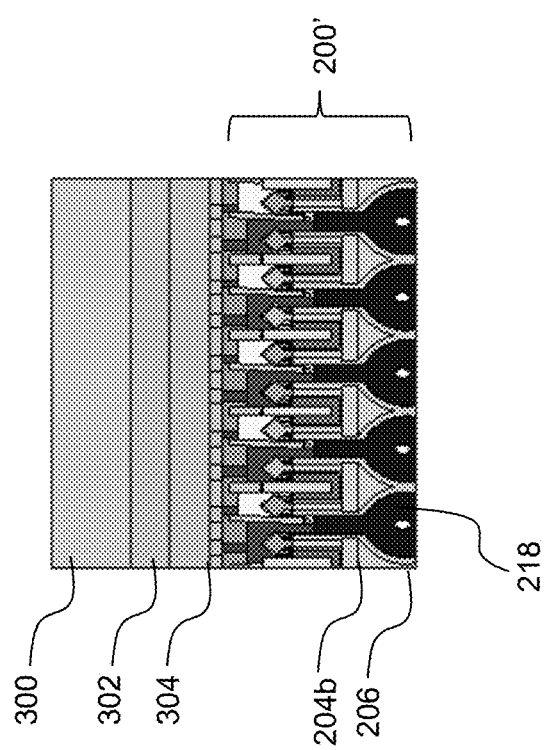

Referring to block 144 in FIG. 1E and FIG. 27b, the second semiconductor layer 204a and a portion of the third semiconductor layer 206 are removed to expose the dummy material 218 in the widened trench 216". In some embodiments, the second semiconductor layer 204a may be removed using a suitable planarization technique, such as CMP. As illustrated in FIG. 27b, after the planarization of the workpiece 200' at block 144, the dummy material 218 in the third semiconductor layer 206 is exposed. Additionally, in embodiments illustrated in FIG. 27b, a portion of the third semiconductor layer 206 and the dummy material 218 are also removed at block 144.

Figure 28B:
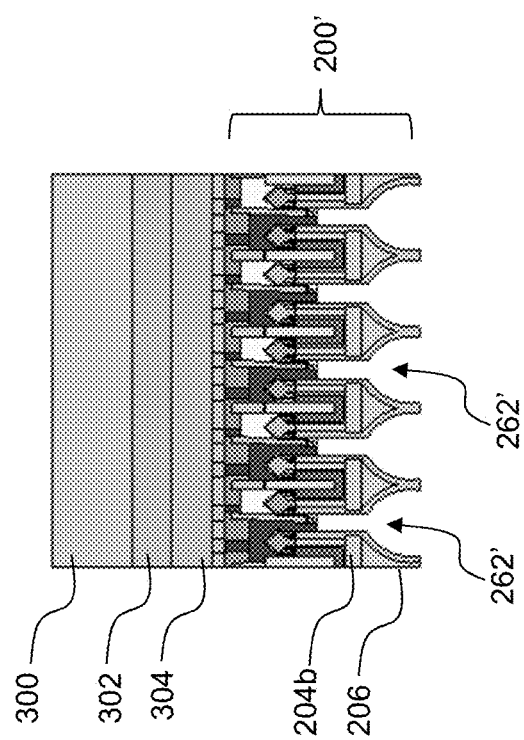

Referring to block 146 in FIG. 1E and FIG. 28b, the dummy material 218 is removed. In some embodiments, the dummy material 218 exposed at block 144 is removed by suitable etching techniques to form trenches 262'. For example, the exposed dummy material 218 may be etched using diluted hydrofluoric acid.

Figure 29B:
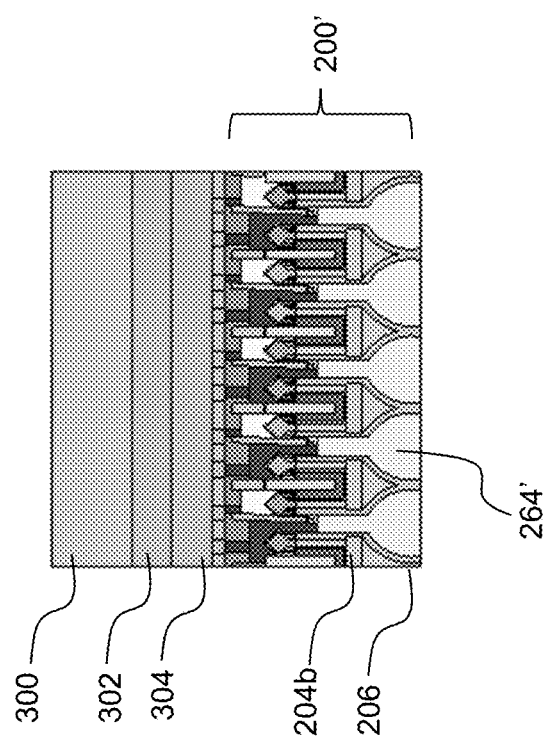

Referring to block 148 in FIG. 1E and FIG. 29b, a metal is deposited over the workpiece 200' to form a metal layer 264'. In some embodiments, the metal material is deposited over the workpiece 200', including over and inside the trenches 262'. In these embodiments, excess metal outside the trenches 262' may be removed by a suitable planarization technique, such as CMP. The metal to form the metal layer 264' may include copper, tungsten, ruthenium, nickel, cobalt, combinations thereof, or other suitable metals. Because the first source/drain contact 248 is in physical contact with the dummy material 218, after the dummy material 218 is removed and the metal layer 264' is formed, the first source/drain contact 248 is electrically coupled to the metal layer 264'. In some embodiments, an interconnect layer overlying the fins 208a and 208b (such as an M0 metal layer) is electrically coupled to a plurality of source/drain contacts, such as the first source/drain contact 248, and therefore electrically coupled to the metal layer 264' through the plurality of source/drain contacts that are spread out through length/width of the workpiece 200'. As a result, the metal layer 264' shown in FIG. 29b may be a part of a BPR or SPR that provides conduction paths in additional to the M0 metal layer and reduces voltage drop due to resistance of the M0 metal layer.

Figure 30B:
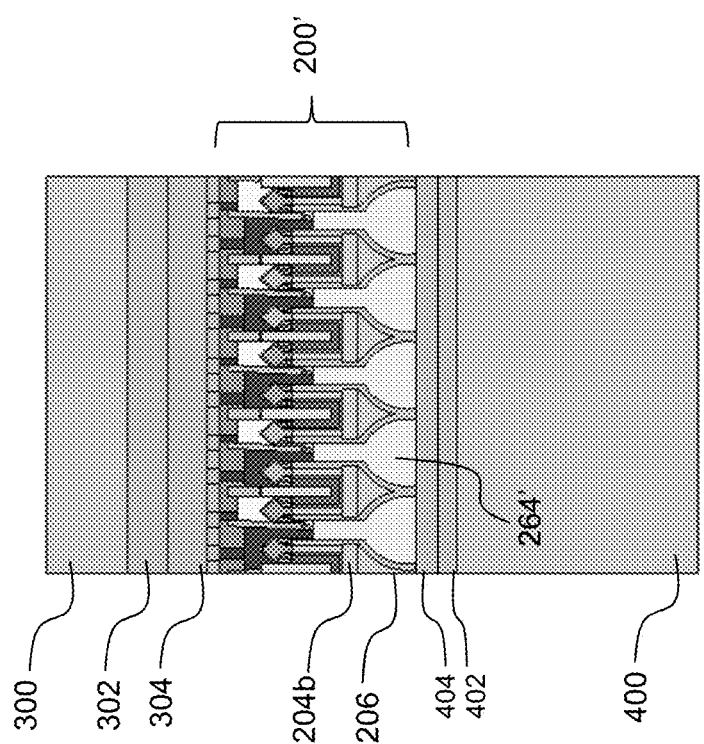

Referring to block 150 in FIG. 1E and FIG. 30b, the workpiece 200' is flipped over and bonded to a wafer 400. In some embodiments, an oxide layer 404 is formed over the metal layer 264' of the workpiece 200' and another oxide layer 402 is formed over the wafer 400. In these embodiments, an anneal is performed to bond the oxide layers 402 and 404 to bond the workpiece 200' on the wafer 400. In some embodiments, the wafer 400 may be a silicon substrate.

Figure 31B:
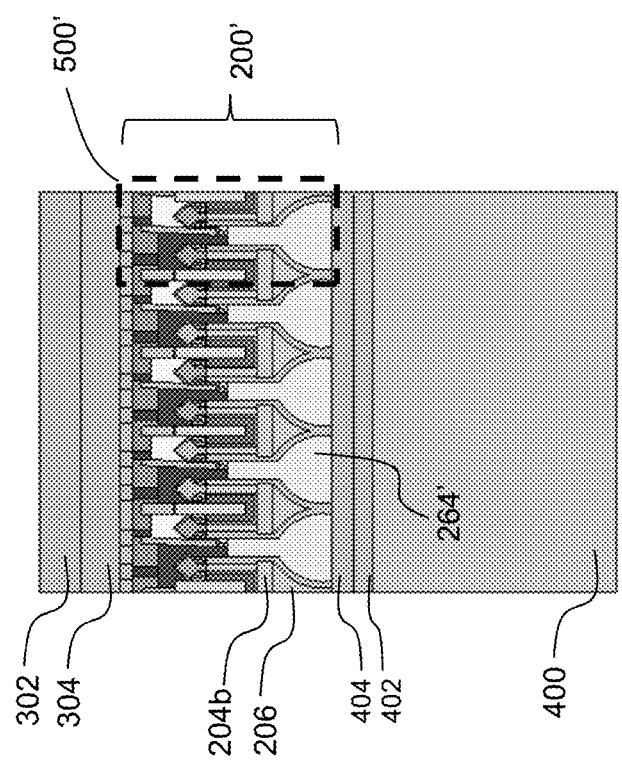

Referring to block 152 in FIG. 1E and FIG. 31b, the carrier wafer 300 is removed from the workpiece 200'. In some embodiments, a planarization technique, such as CMP, is used to remove the carrier wafer 300 from the workpiece 200'. Further processes may be performed to complete the formation of the IC on the workpiece 200'. For example, further metal interconnect structures may be formed over the workpiece 200'.

In some examples, the workpiece 200 in FIG. 31b may include a complementary metal oxide semiconductor (CMOS) device 500' and the CMOS device 500' is enlarged and illustrated in FIG. 32b. The CMOS device 500' includes an N-type FinFET, such as one formed over the fin 208a, and a P-type FinFET, such as one formed over the fin 208b. Referring now to FIG. 32b, the CMOS device 500' includes the metal layer 264'. In some embodiments, along section A-A', the metal layer 264' in the CMOS device 500' includes a thickness T2 between the first source/drain contact 248 and the oxide layer 402, a minimum width W2, a maximum width W3, and a penetration depth D2 through the third semiconductor layer 206. In some implementations, T2 is between about 40 nm and about 100 nm; W2 is between about 15 nm and about 25 nm; W3 is between about 40 nm and about 60 nm; and D2 is between about 10 nm and about 50 nm. In some instances, W3 is greater than W2 and W3 may be about 1.6 times to about 4 times of W2.

The IC structure on the workpiece 200' and the method 100 illustrated in FIGS. 1A-1E provide advantages over conventional IC structure and methods. The metal layer 264' positioned between and below the fins 208a and 208b serves as part of a BPR or SPR and provide electrical conduction paths in addition to the interconnect structures over the fins 208a and 208b to reduce resistivity of metal interconnect without area penalty. In fact, because of additional electrical conductors offered by the widened metal layer 264', interconnect structures over the fins 208a and 208b can be made smaller while maintaining the same or better interconnection resistivity. By using the dummy material 218 as the placeholder for the metal layer 264' in method 100, the metal layer 264' is subject to less heat cycles and less likely to have spiking, which may deteriorate the quality of electrical conductance in the metal layer 264'. Furthermore, second semiconductor layer 204a and fourth semiconductor layer 204b serve as etch stop/etch retardant layers to allow formation of widened trench 216" and therefore widened metal layer 264' to further lower resistivity.

Accordingly, an integrated circuit with a buried interconnect conductor and a method for forming the integrated circuit are described herein. In some embodiments, a method according to the present disclosure includes receiving a substrate that includes a first semiconductor layer, a second semiconductor layer over the first semiconductor layer, and a third semiconductor layer over the second semiconductor layer, the second semiconductor layer being different from the first and third semiconductor layers; forming a plurality of fins over the third semiconductor layer; forming a trench between two of the plurality of fins, wherein the trench extends through the third semiconductor layer and has a bottom surface on the second semiconductor layer; depositing a dummy material in the trench; forming a gate structure over channel regions of the plurality of the fins; forming source/drain features over source/drain regions of the plurality of the fins; bonding the substrate on a carrier wafer; removing the first and second semiconductor layers to expose the dummy material; removing the dummy material in the trench; depositing a conductive material in the trench; and bonding the substrate to a silicon substrate such that the conductive material is in contact with the silicon substrate.

In some embodiments, the first and third semiconductor layers are formed of silicon (Si) and the second semiconductor layer is formed of silicon germanium (SiGe). In some implementations, the forming of the trench includes selectively etching the third semiconductor layer without substantially etching the second semiconductor layer. In some embodiments, the substrate further includes a fourth semiconductor layer over the third semiconductor layer and the fourth semiconductor layer is different from the third semiconductor layer. In some instances, the forming of the trench includes forming an opening between the two of the plurality of fins through the fourth semiconductor layer; and selectively etching the third semiconductor layer through the opening without substantially etching the second and fourth semiconductor layers. In some embodiments, the selectively etching of the third semiconductor layer includes isotropically etching the third semiconductor layer. In some implementations, the dummy material includes silicon oxide, silicon nitride, silicon carbonitride, silicon oxycarbonitride, aluminum oxide, or other metal oxide. In some implementations, the conductive material includes copper, tungsten, nickel, cobalt, ruthenium, or a combination thereof.

In further embodiments, a method includes receiving a substrate that includes a first silicon (Si) layer, a second Si layer over the first Si layer, and a first silicon germanium (SiGe) layer between the first and second Si layers; forming a plurality of fins over the second Si layer; forming a trench between two of the plurality of fins, wherein the trench extends through the second Si layer and has a bottom surface on the first SiGe layer; depositing a dummy material in the trench; forming a gate structure over channel regions of the plurality of the fins; forming source/drain features over source/drain regions of the plurality of the fins; bonding the substrate on a carrier wafer; removing the first Si layer and the first SiGe layer to expose the dummy material; removing the dummy material in the trench; depositing a metal in the trench; and bonding the substrate to a third Si substrate such that the metal is in contact with the third Si substrate.

In some embodiments, the forming of the trench includes selectively etching the second Si layer without substantially etching the first SiGe s layer. In some implementations, the substrate further includes a second SiGe layer over the second Si layer. In some instances, the forming of the trench includes forming an opening through the second SiGe layer; and selectively etching the second Si layer through the opening without substantially etching the first and second SiGe layers. In some embodiments, the selectively etching the second Si layer includes isotropically etching the second Si layer under the two of the plurality of the fins. In some instances, the dummy material includes silicon oxide, silicon nitride, silicon carbonitride, silicon oxycarbonitride, aluminum oxide, or other metal oxide. In some embodiments, the method may further include forming a source/drain contact, wherein the source/drain contact is in contact with the dummy material. In some implementations, the removing of the first Si layer and the first SiGe layer includes removing the first Si layer using a first etching process; and removing the first SiGe layer using a second etching process different from the first etching process.

In further embodiments, an integrated circuit device includes a substrate that includes a silicon (Si) layer and a silicon germanium (SiGe) layer over the Si layers, a plurality of fins over the substrate, and an interconnect conductor disposed within the Si layer and extending between two of the plurality of fins. In some implementations, the integrated circuit device may further include a source/drain feature disposed over one of the plurality of fins, and a source/drain contact in electrical communication with the source/drain feature. The source/drain contact is in electrical communication with the interconnect conductor. In some embodiments, the interconnect conductor extends from between two of the plurality of fins, through the SiGe layer, and into the Si layer. In some of those embodiments, a portion of the interconnect conductor in the Si layer extends laterally under the SiGe layer and the two of the plurality of fins.

It is noted that the embodiments described herein may be employed in the design and/or fabrication of any type of integrated circuit, or portion thereof, which may comprise any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI (PD-SOI) devices, fully-depleted SOI (FD-SOI) devices, other memory cells, or other devices as known in the art. One of ordinary skill may recognize other embodiments of semiconductor devices and/or circuits, including the design and fabrication thereof, which may benefit from aspects of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a substrate that includes a silicon (Si) layer and a silicon germanium (SiGe) layer over the Si layer;
   a plurality of fins over the substrate; and
   an interconnect conductor disposed within the Si layer and extending between two of the plurality of fins.

2. The integrated circuit device of claim 1, further comprising:
   a source/drain feature disposed over one of the plurality of fins; and
   a source/drain contact in electrical communication with the source/drain feature,
   wherein the source/drain contact is in electrical communication with the interconnect conductor.

3. The integrated circuit device of claim 2, wherein the interconnect conductor extends from between two of the plurality of fins, through the SiGe layer, and into the Si layer.

4. The integrated circuit device of claim 3, wherein a portion of the interconnect conductor in the Si layer extends laterally under the SiGe layer and the two of the plurality of fins.

5. The integrated circuit device of claim 3, wherein the interconnect conductor is spaced apart from the two of the plurality of fins by a dielectric layer.

6. The integrated circuit device of claim 5, wherein the interconnect conductor is spaced apart from the SiGe layer, and the Si layer by the dielectric layer.

7. The integrated circuit device of claim 5, wherein the source/drain contact is in direct contact with the dielectric layer.

8. A semiconductor device, comprising:
   a first fin, a second fin, and a third fin disposed over a silicon layer;
   an interconnect conductor disposed between the first fin and the second fin and extending through the silicon layer; and
   a dummy fin disposed between the second fin and the third fin.

9. The semiconductor device of claim 8,
   wherein the first fin, the second fin, and the second fin comprise silicon,
   wherein the dummy fin comprises semiconductor oxide, semiconductor nitride, semiconductor oxynitride, semiconductor carbide, semiconductor carbonitride, semiconductor oxycarbonitride, or a metal nitride.

10. The semiconductor device of claim 8, wherein the interconnect conductor extends through the silicon layer.

11. The semiconductor device of claim 10, wherein the interconnect conductor is spaced apart from the first fin, the second fin, and the silicon layer by a dielectric layer.

12. The semiconductor device of claim 11, wherein the dielectric layer comprises silicon oxide.

13. The semiconductor device of claim 8, further comprising:
    a first source/drain feature disposed over the first fin;
    a silicide layer disposed on the first source/drain feature; and
    a first source/drain contact disposed on the silicide layer,
    wherein the first source/drain contact extends between the first fin and the second fin to be in contact with the interconnect conductor.

14. The semiconductor device of claim 13, wherein the first source/drain contact is spaced apart from the second fin by a dielectric layer that extends into the silicon layer.

15. The semiconductor device of claim 8, further comprising:
    a second source/drain feature disposed over the second fin; and
    a third source/drain feature disposed over the third fin,
    wherein the second source/drain feature is spaced apart from the third source/drain feature by the dummy fin.

16. The semiconductor device of claim 8, wherein the dummy fin is spaced apart from the second fin, the silicon layer, and the third fin by at least one spacer layer.

17. A semiconductor device, comprising:
    a silicon layer;
    a silicon germanium layer disposed over the silicon layer;
    a first fin, a second fin, and a third fin disposed over the silicon germanium layer;
    an interconnect conductor disposed between the first fin and the second fin and extending through the silicon germanium layer; and
    a dummy fin disposed between the second fin and the third fin.

18. The semiconductor device of claim 17, wherein the interconnect conductor further extends through the silicon layer.

19. The semiconductor device of claim 17, wherein the interconnect conductor is spaced apart from the first fin, the second fin, the silicon layer, and the silicon germanium layer by a dielectric layer.

20. The semiconductor device of claim 17,
wherein the first fin, the second fin, and the third fin extend lengthwise along a first direction,
wherein, along a second direction perpendicular to the first direction, the interconnect conductor includes a first width within the silicon layer and a second width within the silicon germanium layer,
wherein the first width is greater than the second width.

* * * * *